US012696600B2

(12) United States Patent
Lee et al.

(10) Patent No.: US 12,696,600 B2
(45) Date of Patent: Jul. 28, 2026

(54) DISPLAY DEVICE USING SEMICONDUCTOR LIGHT-EMITTING ELEMENT

(71) Applicant: LG ELECTRONICS INC., Seoul (KR)

(72) Inventors: Jinhyung Lee, Seoul (KR); Younho Heo, Seoul (KR); Kisu Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 660 days.

(21) Appl. No.: 18/020,516

(22) PCT Filed: Aug. 11, 2020

(86) PCT No.: PCT/KR2020/010582

§ 371 (c)(1),
(2) Date: Feb. 9, 2023

(87) PCT Pub. No.: WO2022/034937

PCT Pub. Date: Feb. 17, 2022

(65) Prior Publication Data

US 2023/0317669 A1     Oct. 5, 2023

(51) Int. Cl.
| | |
|---|---|
| *H10H 20/857* | (2025.01) |
| *H10H 20/01* | (2025.01) |
| *H10W 72/00* | (2026.01) |
| *H10W 72/30* | (2026.01) |
| *H10W 90/00* | (2026.01) |

(52) U.S. Cl.
CPC ........ *H10H 20/857* (2025.01); *H10H 20/018* (2025.01); *H10H 20/032* (2025.01);
(Continued)

(58) Field of Classification Search
CPC ......... H01L 24/29; H01L 24/24; H01L 24/27; H01L 24/32; H01L 24/73;
(Continued)

(56) References Cited

U.S. PATENT DOCUMENTS

| | | | | |
|---|---|---|---|---|
| 10,707,377 B2 * | 7/2020 | Kim | ..................... | H10H 20/832 |
| 11,894,350 B2 * | 2/2024 | Schuele | .................. | H01L 24/92 |

(Continued)

FOREIGN PATENT DOCUMENTS

| | | |
|---|---|---|
| JP | 2017-168760 A | 9/2017 |
| KR | 2001-0097639 A | 11/2001 |

(Continued)

*Primary Examiner* — Alonzo Chambliss
(74) *Attorney, Agent, or Firm* — Birch, Stewart, Kolasch & Birch, LLP

(57) ABSTRACT

A display device according to the present invention is characterized by comprising: a base part; assembly electrodes extending in one direction and formed on the base part; a dielectric layer formed so as to cover the assembly electrodes; a barrier rib part stacked on the dielectric layer while forming holes so as to overlap the assembly electrodes; semiconductor light-emitting elements disposed inside the holes; and wiring electrodes electrically connected to the semiconductor light-emitting elements, wherein the assembly electrodes are formed so as to include Al, and the holes include $AlO_x$.

11 Claims, 18 Drawing Sheets

(52) U.S. Cl.
CPC ........ *H10W 90/00* (2026.01); *H10H 20/0364* (2025.01); *H10W 72/01361* (2026.01); *H10W 72/353* (2026.01); *H10W 72/874* (2026.01); *H10W 90/734* (2026.01)

(58) Field of Classification Search
CPC ...... H01L 2924/12041; H01L 25/0753; H10H 20/857; H10H 20/018; H10H 20/85; H10H 20/834; H10H 20/032; H10W 90/00; H10W 90/734
See application file for complete search history.

(56) References Cited

U.S. PATENT DOCUMENTS 12,444,637 B2 * 10/2025 Chang ................. H10H 20/857

| | | | | |
|---|---|---|---|---|
| 2014/0145153 | A1 * | 5/2014 | Kim ..................... | H10K 59/131 |
| | | | | 361/767 |
| 2019/0325790 | A1 * | 10/2019 | Park ...................... | H10H 20/84 |
| 2019/0326477 | A1 * | 10/2019 | Kim ................... | H01L 25/0753 |
| 2020/0203321 | A1 * | 6/2020 | Choi ...................... | H01L 24/95 |
| 2023/0005886 | A1 * | 1/2023 | Kang ................. | H01L 25/0753 |

FOREIGN PATENT DOCUMENTS

| | | | |
|---|---|---|---|
| KR | 10-2005-0088960 | A | 9/2005 |
| KR | 10-2008-0107386 | A | 12/2008 |
| KR | 10-2017-0136838 | A | 12/2017 |
| KR | 10-2019-0029343 | A | 3/2019 |
| KR | 10-2020-0018521 | A | 2/2020 |
| KR | 10-2020-0024177 | A | 3/2020 |
| KR | 10-2020-0026766 | A | 3/2020 |
| KR | 10-2020-0026770 | A | 3/2020 |

* cited by examiner 155    154    153    159

155   154   153

159

156        155   154   153

159

DISPLAY DEVICE USING SEMICONDUCTOR LIGHT-EMITTING ELEMENT

CROSS REFERENCE TO RELATED APPLICATIONS

This application is a National Stage of PCT International Application No. PCT/KR2020/010582, filed on Aug. 11, 2020, which is hereby expressly incorporated by reference into the present application.

TECHNICAL FIELD

The present disclosure relates to a display device using semiconductor light-emitting elements, and a method for manufacturing the same, and more particularly, to a display device using semiconductor light-emitting elements having a size of several to several tens of $\mu m$, and a method for manufacturing the same.

BACKGROUND ART

In recent years, in the field of display technology, liquid-crystal displays (LCDs), organic light-emitting diodes (OLED) displays, semiconductor light-emitting displays, etc. have been competing to realize large-area displays.

Semiconductor light-emitting devices (elements, diodes) (hereinafter, microLEDs) with a cross-sectional area of 100 $\mu m$, when used in displays, may offer very high efficiency because the displays do not need a polarizer to absorb light. However, in order to implement large-scale displays, several millions of semiconductor light-emitting devices (elements) are required, which makes it difficult to transfer the semiconductor light-emitting devices, compared to other technologies.

In recent years, microLEDs can be transferred by pick & place, laser lift-off or self-assembly. Among others, the self-assembly approach is a method that allows semiconductor light-emitting devices to find their positions on their own in a fluid, which is most advantageous in realizing large-screen display devices.

Self-assembly methods may include a method of directly assembling semiconductor light-emitting devices on a final substrate to be used in a product, and a method of assembling semiconductor light-emitting devices on an assembly substrate and transferring the semiconductor light-emitting devices to a final substrate through an additional transfer process. The direct transfer method is efficient in terms of process, and the hybrid-transfer method is advantageous in terms of additionally using a structure for self-assembly without limitation. Therefore, the two methods are selectively used.

DISCLOSURE OF INVENTION

Technical Problem

One aspect of the present disclosure is to provide a display device designed to improve a transfer yield of semiconductor light-emitting elements.

Another aspect of the present disclosure is to provide a manufacturing process for a display device in which semiconductor light-emitting elements are self-assembled directly on a wiring substrate.

Solution to Problem

A display device according to the present disclosure may include a base, a plurality of assembly electrodes extending in one direction and disposed on the base, a dielectric layer disposed to cover the assembly electrodes, a barrier rib stacked on the dielectric layer while forming holes to overlap the assembly electrodes, semiconductor light-emitting elements disposed inside the holes, and wiring electrodes electrically connected to the semiconductor light-emitting elements, wherein the assembly electrodes may be formed to contain Al, and wherein each of the holes may contain $AlO_x$ therein.

According to the present disclosure, the $AlO_x$ may be produced in at least one region between the semiconductor light-emitting element and the dielectric layer and between the semiconductor light-emitting element and the barrier rib.

According to the present disclosure, the $AlO_x$ may be produced irregularly inside the holes.

According to the present disclosure, each of the assembly electrodes may include a plurality of layers, and a layer in contact with the dielectric layer, among the plurality of layers, may be formed to contain Al.

According to the present disclosure, the dielectric layer may be made of an $Al_2O_3$ material.

According to the present disclosure, the dielectric layer may be a porous layer made of an $SiO_2$ or $SiN_x$ material.

According to the present disclosure, each of the semiconductor light-emitting elements may include a first conductive electrode, a first conductive semiconductor layer having the first conductive electrode formed thereon, an active layer formed on the first conductive semiconductor layer, a second conductive semiconductor layer formed on the active layer, and a second conductive electrode formed on the second conductive semiconductor layer. The semiconductor light-emitting element may be formed symmetrically with respect to at least one direction.

According to the present disclosure, at least one of the first conductive electrode and the second conductive electrode may contain a magnetic substance.

According to the present disclosure, the display device may further include a planarization layer formed to cover one surface of the semiconductor light-emitting element, and the planarization layer may include a first electrode hole exposing the first conductive electrode of the semiconductor light-emitting element, and a second electrode hole exposing the second conductive electrode of the semiconductor light-emitting element.

According to the present disclosure, the wiring electrodes may be disposed on the planarization layer, and the wiring electrodes may be electrically connected to the semiconductor light-emitting element through the first electrode hole and the second electrode hole, respectively.

A method for manufacturing a display device according to the present disclosure may include putting semiconductor light-emitting elements into a chamber containing a fluid, disposing a substrate including assembly electrodes on a top of the chamber, seating the semiconductor light-emitting elements at preset positions on the assembly substrate using a magnetic field and an electric field, forming a planarization layer to cover the semiconductor light-emitting elements, and forming wiring electrodes on the substrate to be electrically connected to the semiconductor light-emitting elements. The assembly electrodes may be formed to contain Al, and $AlO_x$ may be produced on the substrate during the step of seating the semiconductor light-emitting elements at the preset positions on the substrate using the electric field and the magnetic field.

According to the present disclosure, the substrate may include a base, a plurality of assembly electrodes extending in one direction and disposed on the base, a dielectric layer disposed to cover the assembly electrodes, and a barrier rib stacked on the dielectric layer while forming holes to overlap the assembly electrodes. The semiconductor light-emitting elements may be seated inside the holes.

According to the present disclosure, a voltage of ±6V or more may be applied to the assembly electrodes so that an electric field is formed on one surface of the substrate.

According to the present disclosure, the $AlO_x$ may be produced inside the holes as a voltage is applied to the assembly electrodes.

According to the present disclosure, each of the assembly electrodes may include a plurality of layers, and a layer in contact with the dielectric layer, among the plurality of layers, may be formed to contain Al.

According to the present disclosure, the dielectric layer may be made of an $Al_2O_3$ material.

According to the present disclosure, the dielectric layer may be a porous layer made of an $SiO_2$ or $SiN_x$ material.

Advantageous Effects of Invention

According to the present disclosure, a substrate can be designed to induce an electrochemical reaction by which $Al_2O_3$ is produced inside holes, in which semiconductor light-emitting elements are seated, so as to minimize loss of the semiconductor light-emitting elements during a post-process, which may result in improving a transfer yield of the semiconductor light-emitting elements.

In addition, according to the present disclosure, semiconductor light-emitting elements can be directly transferred to a wiring substrate in a self-assembly manner, which can exclude a post-process for fixing the semiconductor light-emitting elements seated in holes, thereby simplifying a manufacturing process.

MODE FOR THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. Furthermore, it will be understood that when an element such as a layer, region or substrate is referred to as being "on" another element, it can be directly on the another element or an intermediate element may also be interposed therebetween.

A display device disclosed herein may include a portable (mobile) phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, the configuration according to the implementation described herein can be applied as long as it can include a display even in a new product form to be developed later.

Figure 1:
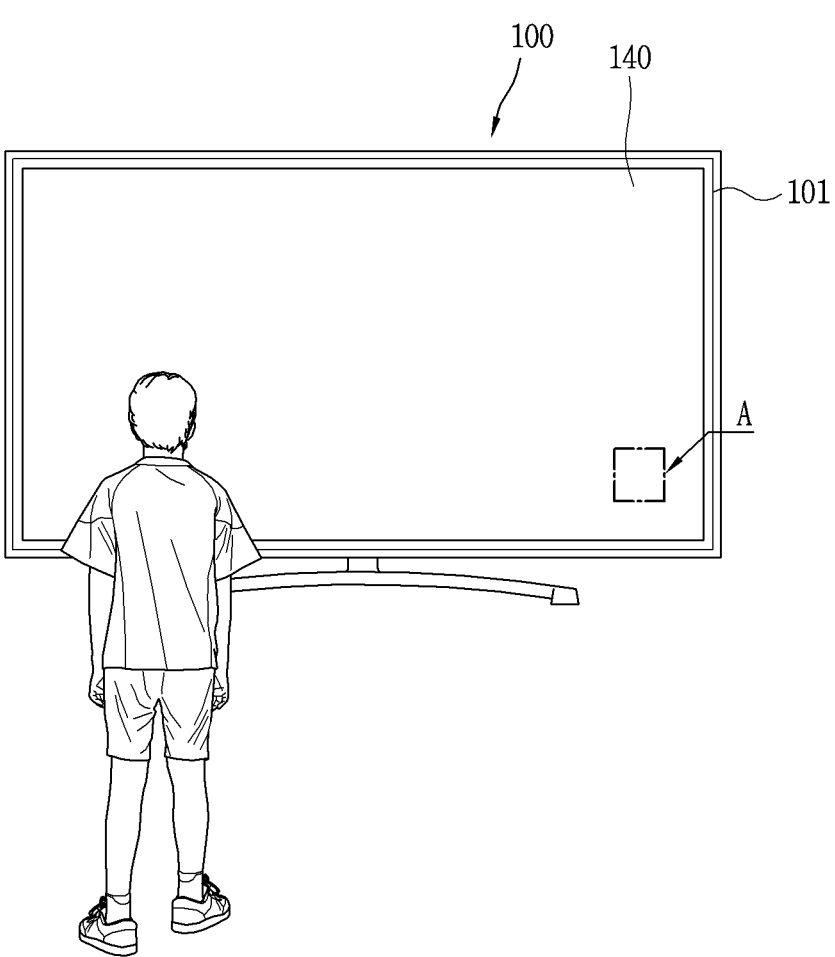
FIG. 1 is a conceptual view illustrating one embodiment of a display device using semiconductor light-emitting elements.
Figure 2:
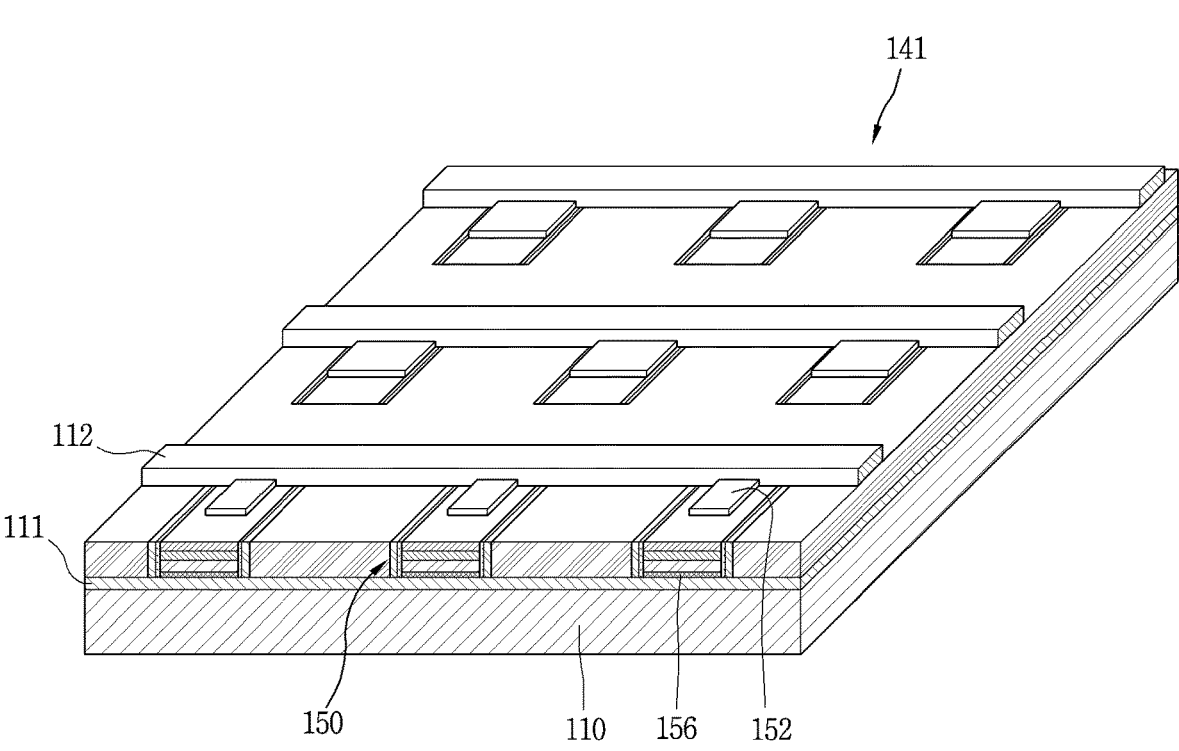
FIG. 2 is a partial enlarged view of a portion A in the display device of FIG. 1.
Figure 3:
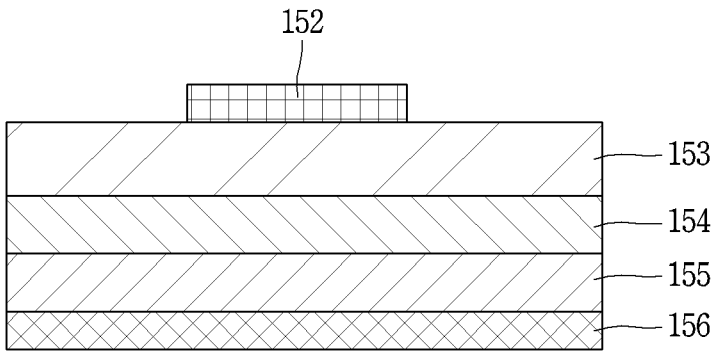
FIG. 3 is an enlarged view of the semiconductor light-emitting element of FIG. 2.
Figure 4:
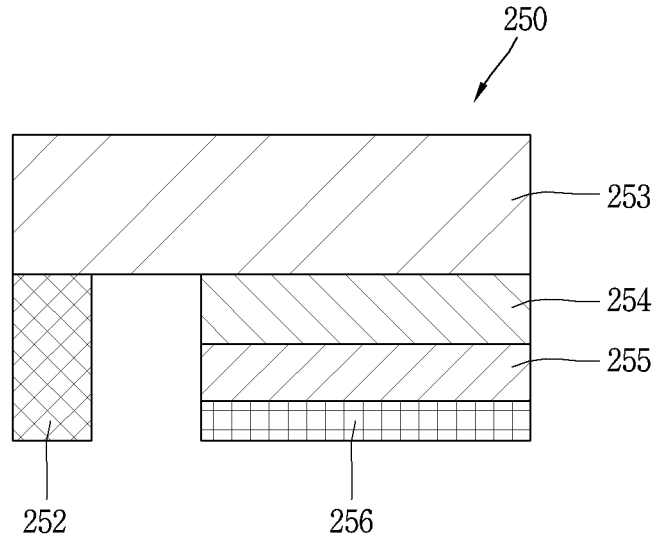
FIG. 4 is a view illustrating another embodiment of the semiconductor light-emitting element of FIG. 2.

FIG. 1 is a conceptual view illustrating one embodiment of a display device using semiconductor light-emitting elements, FIG. 2 is a partial enlarged view of a portion A in the display device of FIG. 1, FIG. 3 is an enlarged view of the semiconductor light-emitting element of FIG. 2, and FIG. 4 is a view illustrating another embodiment of the semiconductor light-emitting element of FIG. 2.

As illustrated, information processed by a controller of a display device 100 may be output on a display module 140. A closed loop-shaped case 101 that runs around the rim of the display module 140 may define the bezel of the display device 100.

The display module 140 may include a panel 141 that displays an image, and the panel 141 may include micro-sized semiconductor light-emitting elements (or diodes) 150 and a wiring substrate 110 where the semiconductor light-emitting elements 150 are mounted.

The wiring substrate 110 may be provided with wirings, which can be connected to n-type electrodes 152 and p-type electrodes 156 of the semiconductor light-emitting elements 150. As such, the semiconductor light-emitting elements 150 may be provided on the wiring substrate 110 as individual pixels that emit light on their own.

The image displayed on the panel 141 may be visual information, which is rendered by controlling the light emission of unit pixels arranged in a matrix configuration independently through the wirings.

The present disclosure takes microLEDs (light-emitting elements) as an example of the semiconductor light-emitting elements 150 which convert current into light. The microLEDs may be light-emitting elements that are small in size less than 100 μm. The semiconductor light-emitting elements 150 may have light-emitting regions of red, green, and blue, and unit pixels may be produced by combinations of these colors. That is, the unit pixels are the smallest units for producing one color. Each unit pixel may contain at least three microLEDs.

More specifically, referring to FIG. 3, the semiconductor light-emitting element 150 may have a vertical structure.

For example, the semiconductor light-emitting elements 150 may be implemented as high-power light-emitting elements that are composed mostly of gallium nitride (GaN), with some indium (In) and/or aluminum (Al) added to it, and emit light of various colors.

The vertical type semiconductor light-emitting element includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 at the bottom may be electrically connected to a p-electrode 111 of the wiring substrate, and the upper n-type electrode 152 at the top may be electrically connected to an n-electrode 112 above the semiconductor light-emitting element. The electrodes can be disposed in an upward/downward direction in the vertical semiconductor light-emitting element 150, thereby providing a great advantage of reducing a chip size.

In another example, referring to FIG. 4, the semiconductor light-emitting elements may be flip chip-type light-emitting elements.

As an example of such a flip chip-type light-emitting element, the semiconductor light-emitting element 250 may include a p-type electrode 256, a p-type semiconductor layer 255 disposed on the p-type layer 256, an active layer 254 disposed on the p-type semiconductor layer 255, an n-type semiconductor layer 253 disposed on the active layer 254, and an n-type electrode 252 vertically separated from the p-type electrode 256 on the n-type semiconductor layer 253. In this case, both the p-type electrode 256 and the n-type electrode 252 may be electrically connected to a p electrode and an n electrode of the wiring substrate, below the semiconductor light-emitting element.

The vertical semiconductor light-emitting element and a flip-type light-emitting element each may be used as a green semiconductor light-emitting element, blue semiconductor light-emitting element, or red semiconductor light-emitting element. The green semiconductor light-emitting element and the blue semiconductor light-emitting element may be implemented as high-power light-emitting elements that are composed mostly of gallium nitride (GaN), with some indium (In) and/or aluminum (Al) added to it, and emit green and blue light, respectively. As an example, the semiconductor light-emitting elements may be made of gallium nitride thin films which include various layers of n-Gan, p-GaN, AlGaN, InGaN, etc. More specifically, the p-type semiconductor layer may be P-type GaN, and the n-type semiconductor layer may be N-type GaN. However, for the red semiconductor light-emitting element, the p-type semiconductor layer may be P-type GaAs, and the n-type semiconductor layer may be N-type GaAs.

Moreover, the p-type semiconductor layer may be P-type GaN doped with Mg on the p electrode, and the n-type semiconductor layer may be N-type GaN doped with Si on the n electrode. In this case, the above-described semiconductor light-emitting elements may be semiconductor light-emitting elements without the active layer.

In some examples, referring to FIGS. 1 to 4, because of the very small size of the light-emitting elements, self-emissive, high-definition unit pixels may be arranged on the display panel, and therefore the display device can deliver high picture quality.

In the display device using the semiconductor light-emitting elements, semiconductor light-emitting elements may be grown on a wafer, formed through mesa and isolation, and used as individual pixels. The micro-sized semiconductor light-emitting elements 150 should be transferred onto preset positions on a substrate of the display panel. One of the transfer technologies available may be pick and place, but it has a low success rate and requires a lot of time. In another example, a number of diodes may be transferred at a time by using a stamp or roll, which, however, is not suitable for large-screen displays because of limited yields. The present disclosure proposes a new method and device for manufacturing a display device that can solve these problems.

To this end, a new method for manufacturing a display device will be described first below. FIGS. 5A to 5E are conceptual views illustrating a new process for manufacturing the semiconductor light-emitting elements (or diodes).

In this specification, a display device using passive matrix (PM) semiconductor light-emitting elements will be illustrated. It should be noted that the illustration given below is also applied to active matrix (AM) semiconductor light-emitting elements. In addition, the self-assembly method described in this specification can be applied to both horizontal semiconductor light-emitting elements and vertical semiconductor light-emitting elements.

Figure 5A:
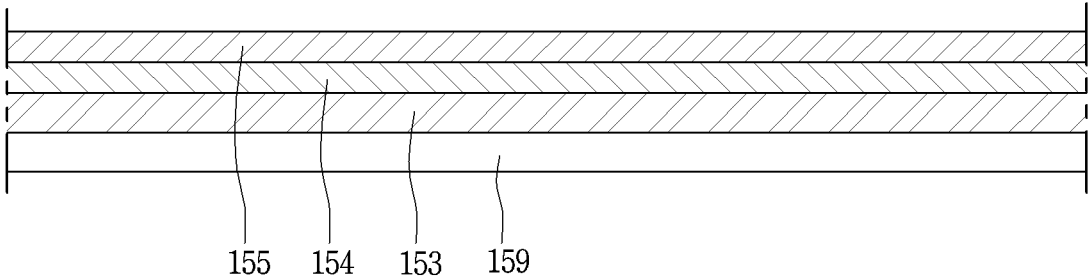
FIGS. 5A to 5E are conceptual diagrams illustrating a new process for manufacturing a semiconductor light-emitting element.

First of all, according to the manufacturing method of the display device, a first conductive semiconductor layer 153, an active layer 154, and a second conductive semiconductor layer 155 are grown on a growth substrate 159 (FIG. 5A).

Once the first conductive semiconductor layer 153 is grown, the active layer 154 may be grown on the first conductive semiconductor layer 153 and then the second conductive semiconductor layer 155 may be grown on the active layer 154. By sequentially growing the first conductive semiconductor layer 153, the active layer 154, and the second conductive semiconductor layer 155, the first conductive semiconductor layer 153, the active layer 154, and the second conductive semiconductor layer 155 may form a stack structure as illustrated in FIG. 5A.

In this case, the first conductive semiconductor layer 153 may be a n-type semiconductor layer, and the second conductive semiconductor layer 155 may be a p-type semiconductor layer. However, the present disclosure is not necessarily limited to this, and the first conductive type may be p-type and the second conductive type may be n-type.

Moreover, although this exemplary implementation is illustrated by assuming the presence of the active layer, the active layer may be omitted, if necessary, as stated above. In an example, the p-type semiconductor layer may be P-type GaN doped with Mg, and the n-type semiconductor layer may be N-type GaN doped with Si on the n electrode.

The growth substrate 159 (wafer) may be formed of, but not limited to, light-transmissive material, for example, one of sapphire (Al$_2$O$_3$), GaN, ZnO, and AlO. Also, the growth substrate 159 may be made of a material suitable for growing semiconductor materials, namely, a carrier wafer. The growth substrate 2101 may also be formed of a material having high thermal conductivity. The growth substrate 2101 may use at least one of a SiC substrate having higher thermal conductivity than the sapphire (Al$_2$O$_3$) substrate, Si, GaAs, GaP, InP and Ga$_2$O$_3$, in addition to a conductive substrate or an insulating substrate.

Figure 5B:
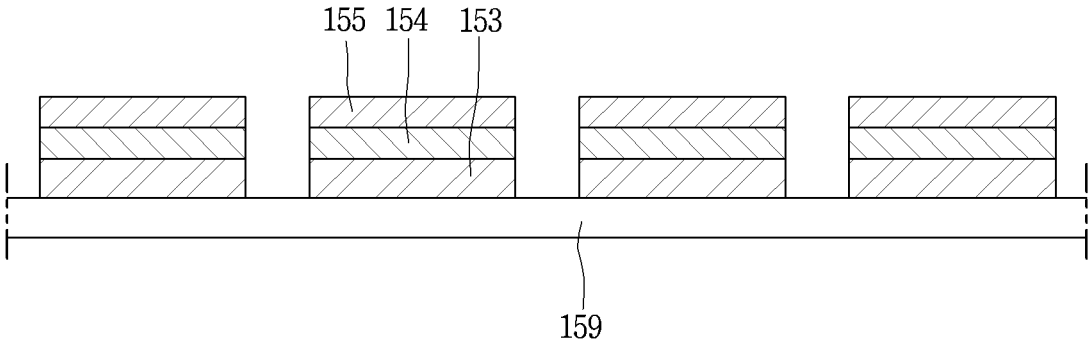

Next, a plurality of semiconductor light-emitting elements may be formed by removing at least parts of the first conductive semiconductor layer 153, the active layer 154, and the second conductive semiconductor layer 155 (FIG. 5B).

More specifically, isolation may be performed so that the plurality of light-emitting elements form a light-emitting element array. That is, a plurality of semiconductor light-emitting elements may be formed by vertically etching the first conductive semiconductor layer 153, the active layer 154, and the second conductive semiconductor layer 155.

In the case of horizontal semiconductor light-emitting elements, a mesa process may be performed which exposes the first conductive semiconductor layer 153 to the outside by vertically removing part of the active layer 154 and the second conductive semiconductor layer 155, and then isolation may be performed which forms an array of semiconductor light-emitting elements by etching the first conductive semiconductor layer 153.

Figure 5C:
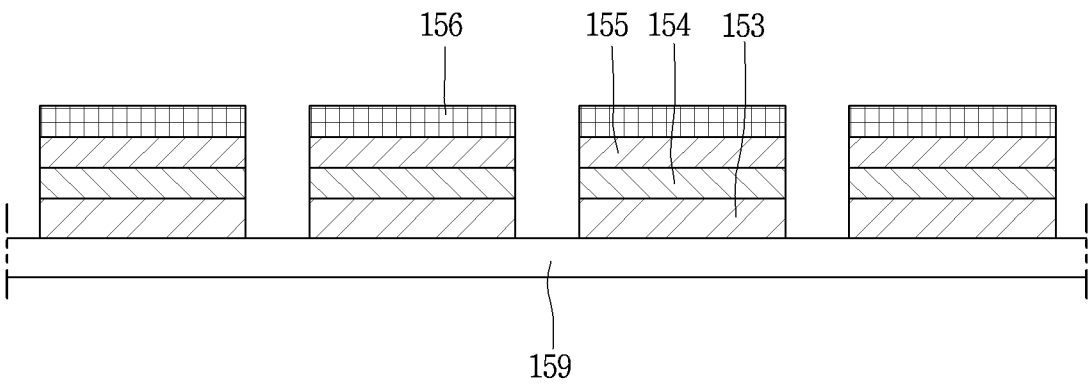

Next, a second conductive electrode 156 (or p-type electrode) may be formed on one surface of the second conductive semiconductor layer 155 (FIG. 5C). The second conductive electrode 156 may be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 may serve as an n-type electrode.

Figure 5D:
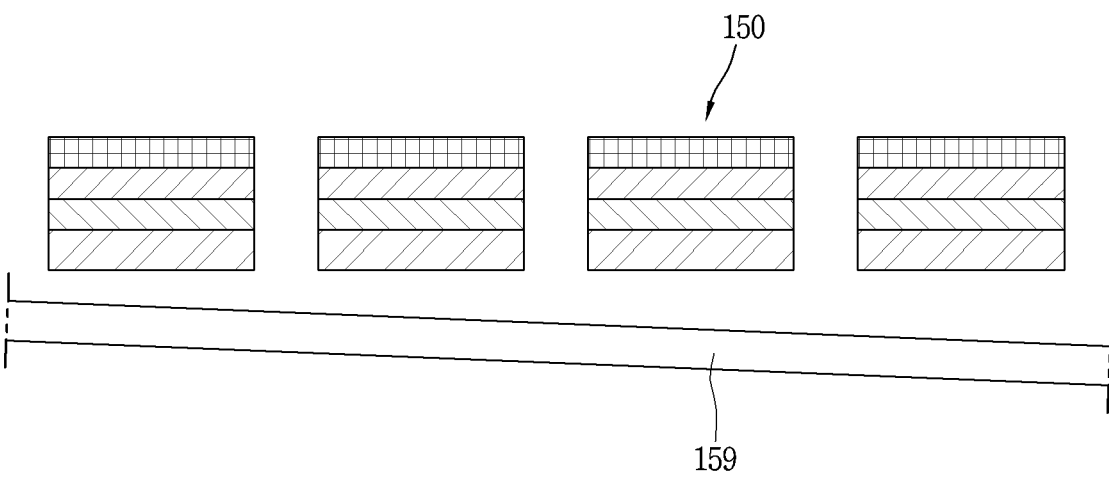

Next, the growth substrate 159 may be removed, thus leaving a plurality of semiconductor light-emitting elements. For example, the growth substrate 159 may be removed using laser lift-off (LLO) or chemical lift-off (CLO) (FIG. 5D).

Figure 5E:
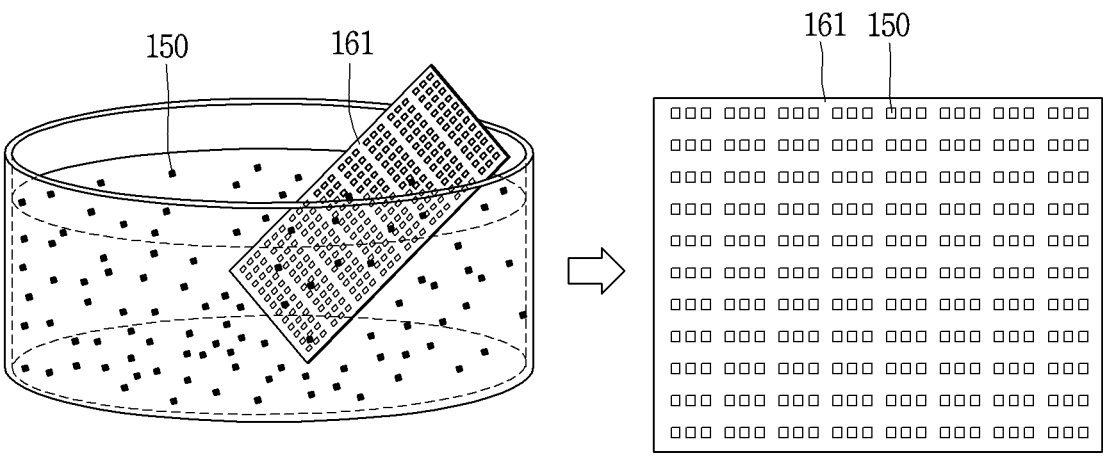

Afterwards, the step of mounting the semiconductor light-emitting elements 150 on a substrate in a chamber filled with a fluid may be performed (FIG. 5E).

For example, the semiconductor light-emitting elements 150 and the substrate 161 may be put into a chamber filled with a fluid, and the semiconductor light-emitting elements may be self-assembled onto the substrate 161 using fluidity, gravity, surface tension, etc. In this case, the substrate may be an assembly substrate 161.

In another example, a wiring substrate, instead of the assembly substrate 161, may be put into a fluid chamber, and the semiconductor light-emitting elements 150 may be mounted directly onto the wiring substrate. In this case, the substrate may be a wiring substrate. For convenience of explanation, the present disclosure is illustrated with an example in which the semiconductor light-emitting elements 150 are mounted onto the assembly substrate 161.

To facilitate the mounting of the semiconductor light-emitting elements 150 onto the assembly substrate 161, cells (not shown) into which the semiconductor light-emitting elements 150 are fitted may be provided on the assembly substrate 161. Specifically, cells where the semiconductor light-emitting elements 150 are mounted may be disposed on the assembly substrate 161 at positions where the semiconductor light-emitting elements 150 are aligned with wiring electrodes. The semiconductor light-emitting elements 150 may be assembled to the cells as they move within the fluid.

After arraying the semiconductor light-emitting elements 150 on the assembly substrate 161, the semiconductor light-emitting elements 150 may be transferred to the wiring substrate from the assembly substrate 161, thereby enabling a large-area transfer across a large area. Thus, the assembly substrate 161 may be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material may be placed on the semiconductor light-emitting elements so that the semiconductor light-emitting elements are moved by magnetic force, and the semiconductor light-emitting elements may be mounted at preset positions by an electric field in the process of being moved. This transfer method and device will be described in more detail below with reference to the accompanying drawings.

Figure 6:
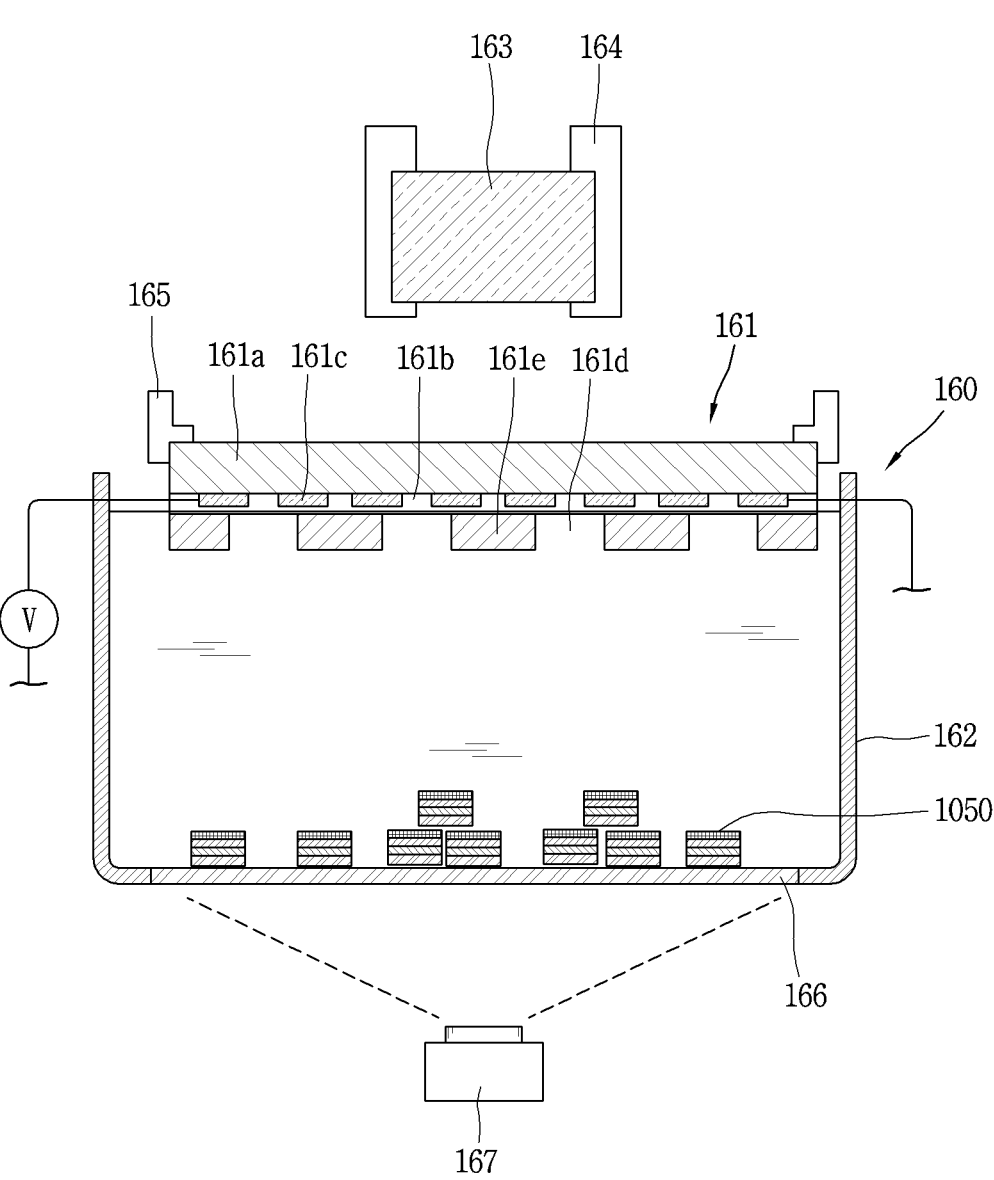
FIG. 6 is a conceptual diagram illustrating one embodiment of a device for self-assembling semiconductor light-emitting elements according to the present disclosure.
Figure 7:
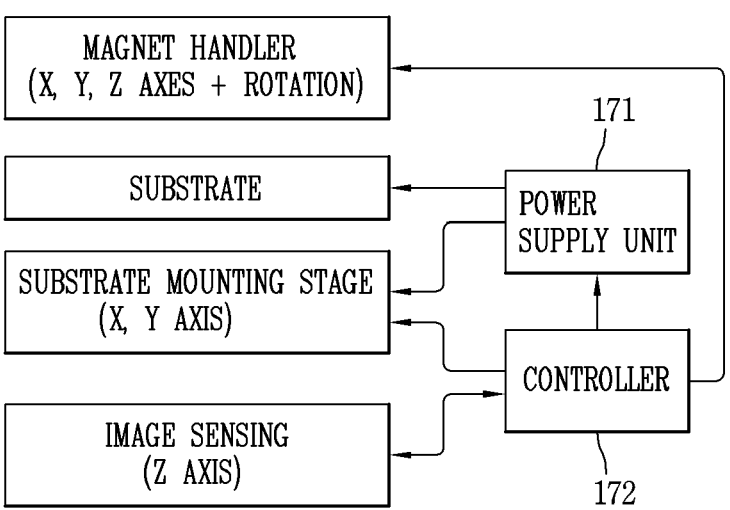
FIG. 7 is a block diagram of the self-assembly device of FIG. 6.

FIG. 6 is a conceptual diagram illustrating an example of a device for self-assembling semiconductor light-emitting elements and FIG. 7 is a block diagram of the self-assembly device of FIG. 6. FIGS. 8A to 8E are conceptual view illustrating a process for self-assembling semiconductor light-emitting elements using the self-assembly device of FIG. 6 and FIG. 9 is a conceptual view illustrating the semiconductor light-emitting element of FIGS. 8A to 8E.

Referring to FIGS. 6 and 7, the self-assembly device 160 may include a fluid chamber 162, a magnet 163, and a position controller 164.

The fluid chamber 162 may define a space for receiving a plurality of semiconductor light-emitting elements. The space may be filled with a fluid, and the fluid may be an assembly solution, which includes water or the like. Thus, the fluid chamber 162 may be a water tank and configured as an open-type. However, the present disclosure is not limited to this, and the fluid chamber 162 may be a closed-type chamber in which the space is in a closed state.

A substrate 161 may be placed in the fluid chamber 162 so that an assembly surface where the semiconductor light-emitting elements 150 are assembled faces downwards. For example, the substrate 161 may be fed to an assembly site by a feed unit (transfer unit), and the transfer unit may include a stage 165 where the substrate is mounted. The position of the stage 165 may be adjusted by the controller, whereby the substrate 161 can be fed to the assembly site.

In this instance, the assembly surface of the substrate 161 at the assembly site may face the bottom of the fluid chamber 162. As illustrated in the drawings, the assembly surface of the substrate 161 may be placed to be soaked with the fluid in the fluid chamber 162. Thus, the semiconductor light-emitting elements 150 in the fluid may be moved to the assembly surface.

The substrate 161 may be an assembly substrate where an electric field can be formed, and may include a base portion 161*a*, a dielectric layer 161*b*, and a plurality of electrodes 161*c*.

The base portion 161*a* may be made of an insulating material, and the plurality of electrodes 161*c* may be thin-film or thick-film bi-planar electrodes that are patterned on one surface of the base portion 161*a*. The electrodes 161*c* may be formed of a stack of Ti/Cu/Ti, Ag paste, ITO, etc.

The dielectric layer 161*b* may be made of an inorganic material such as $SiO_2$, $SiN_x$, SiON, $Al_2O_3$, $TiO_2$, $HfO_2$, etc. Alternatively, the dielectric layer 161*b* may be an organic insulator and configured as a single layer or multi-layers. The thickness of the dielectric layer 161*b* may range from several tens of nm to several μm.

Further, the substrate 161 according to the present disclosure includes a plurality of cells 161*d* that are separated by barrier walls. The cells 161*d* may be sequentially arranged in one direction and made of a polymer material. Furthermore, the barrier walls 161*e* defining the cells 161*d* may be made to be shared with neighboring cells 161*d*. The barrier walls 161*e* may protrude from the base portion 161*a*, and the cells 161*d* may be sequentially arranged in one direction by the barrier walls 161*e*. More specifically, the cells 161*d* may be sequentially arranged in column and row directions and have a matrix configuration.

As illustrated in the drawings, the cells 161*d* may have recesses for receiving the semiconductor light-emitting elements 150, and the recesses may be spaces defined by the barrier walls 161*e*. The recesses may have a shape identical or similar to the shape of the semiconductor light-emitting elements. For example, if the semiconductor light-emitting elements are rectangular, the recesses may be rectangular too. Moreover, although not shown, the recesses formed in the cells may be circular if the semiconductor light-emitting elements are circular. Moreover, each of the cells is configured to accommodate a single semiconductor light-emitting element. In other words, a single semiconductor light-emitting element is accommodated in a single cell.

Meanwhile, the plurality of electrodes 161*c* may have a plurality of electrode lines that are placed on bottoms of the cells 161*d*, and the plurality of electrode lines may extend to neighboring cells.

The plurality of electrodes 161*c* may be placed beneath the cells 161*d*, and different polarities may be applied to create an electric field within the cells 161*d*. To form an electric field, the dielectric layer 161*b* may form the bottom of the cells 161*d* while covering the electrodes 161*c*. With this structure, when different polarities are applied to a pair of electrodes 161*c* beneath each cell 161*d*, an electric field may be formed and the semiconductor light-emitting elements can be inserted into the cells 161*d* by the electric field.

The electrodes of the substrate 161 at the assembly site may be electrically connected to a power supply 171. The power supply unit 171 may perform the function of generating the electric field by applying power to the electrodes.

As shown in the drawings, the self-assembly device may have the magnet 163 for applying magnetic force to the semiconductor light-emitting elements. The magnet 163 may be disposed at a distance from the fluid chamber 162 to apply magnetic force to the semiconductor light-emitting elements 150. The magnet 163 may be disposed to face an opposite side of the assembly surface of the substrate 161, and the position of the magnet 163 may be controlled by the position controller 164 connected to the magnet 163.

The semiconductor light-emitting elements 1050 may have a magnetic material so that they can be moved within the fluid by a magnetic field.

Referring to FIG. 9, a semiconductor light-emitting element having a magnetic material may include a first conductive electrode 1052, a second conductive electrode 1056, a first conductive semiconductor layer 1053 on which the first conductive electrode 1052 is disposed, a second conductive semiconductor layer 1055 which overlaps the first conductive semiconductor layer 1052 and on which the second conductive electrode 1056 is disposed, and an active layer 1054 disposed between the first and second conductive semiconductor layers 1053 and 1055.

Here, the first conductive may refer to p-type, and the second conductive type may refer to n-type, or vice versa. As stated previously, the semiconductor light-emitting element may be formed without the active layer.

Meanwhile, the first conductive electrode 1052 may be formed after the semiconductor light-emitting element is assembled onto the wiring substrate by the self-assembling of the semiconductor light-emitting element. Further, the second conductive electrode 1056 may include a magnetic material. The magnetic material may refer a magnetic metal. The magnetic material may be Ni, SmCo, etc. In another example, the magnetic material may include at least one of Gd-based, La-based, and Mn-based materials.

The magnetic material may be provided in the form of particles on the second conductive electrode 1056. Alternatively, one layer of a conductive electrode including a magnetic material may be made of the magnetic material. As an example, the second conductive electrode 1056 of the semiconductor light-emitting element 1050 may include a first layer 1056*a* and a second layer 1056*b*, as illustrated in FIG. 9. Here, the first layer 1056*a* may include a magnetic material, and the second layer 1056*b* may include a metal material other than the magnetic material.

As illustrated in the drawing, in this example, the first layer 1056*a* including the magnetic material may be disposed in contact with the second conductive semiconductor layer 1055. In this case, the first layer 1056*a* may be disposed between the second layer 1056*b* and the second conductive semiconductor layer 1055. The second layer 1056*b* may be a contact metal that is connected to the second electrode on the wiring substrate. However, the present disclosure is not necessarily limited to this, and the magnetic material may be disposed on one surface of the first conductive semiconductor layer.

Still referring to FIGS. 6 and 7, more specifically, on top of the fluid chamber of the self-assembly device, a magnet handler capable of automatically or manually moving the magnet 163 on the x, y, and z axes or a motor capable of rotating the magnet 163 may be provided. The magnet handler and motor may constitute the position controller 164. As such, the magnet 163 may rotate in a horizontal, clockwise, or counterclockwise direction with respect to the substrate 161.

Meanwhile, the fluid chamber 162 may be provided with a light-transmissive bottom plate 166, and the semiconductor light-emitting elements may be disposed between the bottom plate 166 and the substrate 161. An image sensor 167 may be disposed to face the bottom plate 166 so as to monitor the inside of the fluid chamber 162 through the bottom plate 166. The image sensor 167 may be controlled by a controller 172, and may include an inverted-type lens, CCD, etc. so as to observe the assembly surface of the substrate 161.

The self-assembly device may be configured to use a magnetic field and an electric field in combination. With this, the semiconductor light-emitting elements can be mounted at preset positions on the substrate by the electric field while being moved by changes in the position of the magnet. Hereinafter, the assembly process using the self-assembly device will be described in more detail.

First of all, a plurality of semiconductor light-emitting elements 1050 having a magnetic material may be formed through the process explained with reference to FIGS. 5A to 5C. In this case, the magnetic material may be deposited onto the semiconductor light-emitting elements in the process of forming the second conductive electrode of FIG. 5C.

Figure 8A:
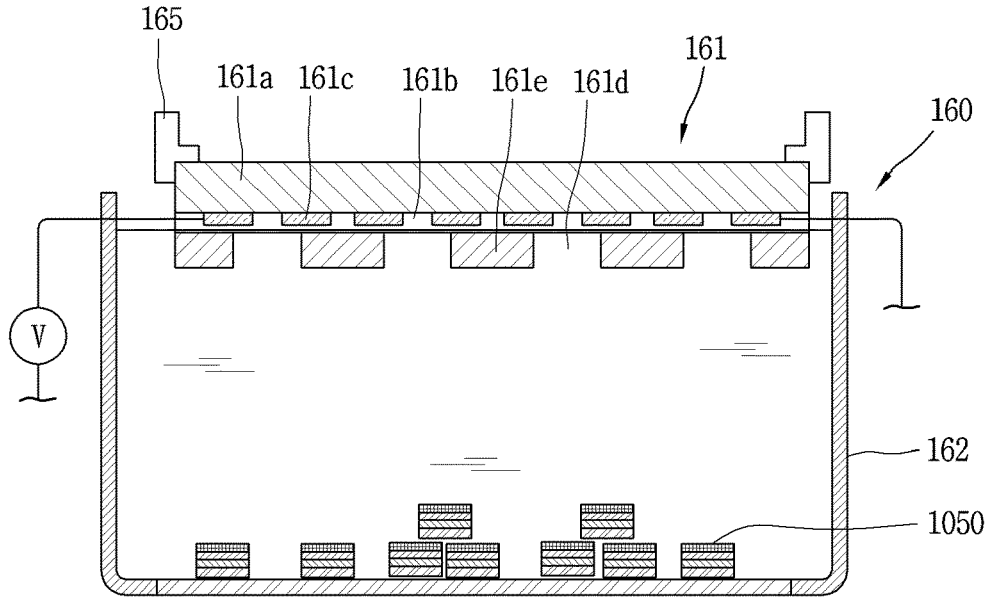
FIGS. 8A to 8E are conceptual views illustrating a process for self-assembling semiconductor light-emitting elements using the self-assembly device of FIG. 6.
Figure 9:
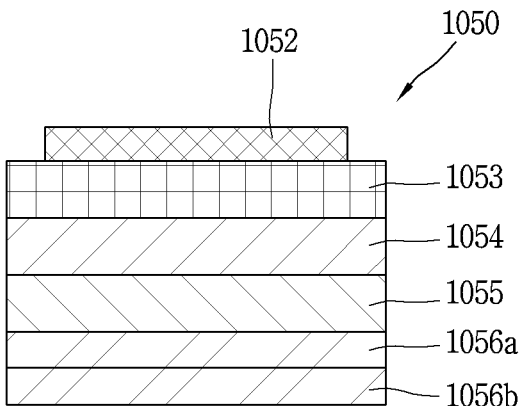
FIG. 9 is a view illustrating one embodiment of a semiconductor light-emitting element that is used in the self-assembly process of FIGS. 8A to 8E.

Next, the substrate 161 may be fed to an assembly site, and the semiconductor light-emitting elements 1050 may be put into the fluid chamber 162 (FIG. 8A).

As described above, the assembly site on the substrate 161 may be a position at which the substrate 161 is placed in the fluid chamber 162 in such a way that an assembly surface where the semiconductor light-emitting elements 150 are assembled faces downwards.

In this case, some of the semiconductor light-emitting elements 1050 may sink to the bottom of the fluid chamber 162 and some of them may float in the fluid. When the fluid chamber 162 is provided with the light-transmissive bottom plate 166, some of the semiconductor light-emitting elements 1050 may sink to the bottom plate 166.

Figure 8B:
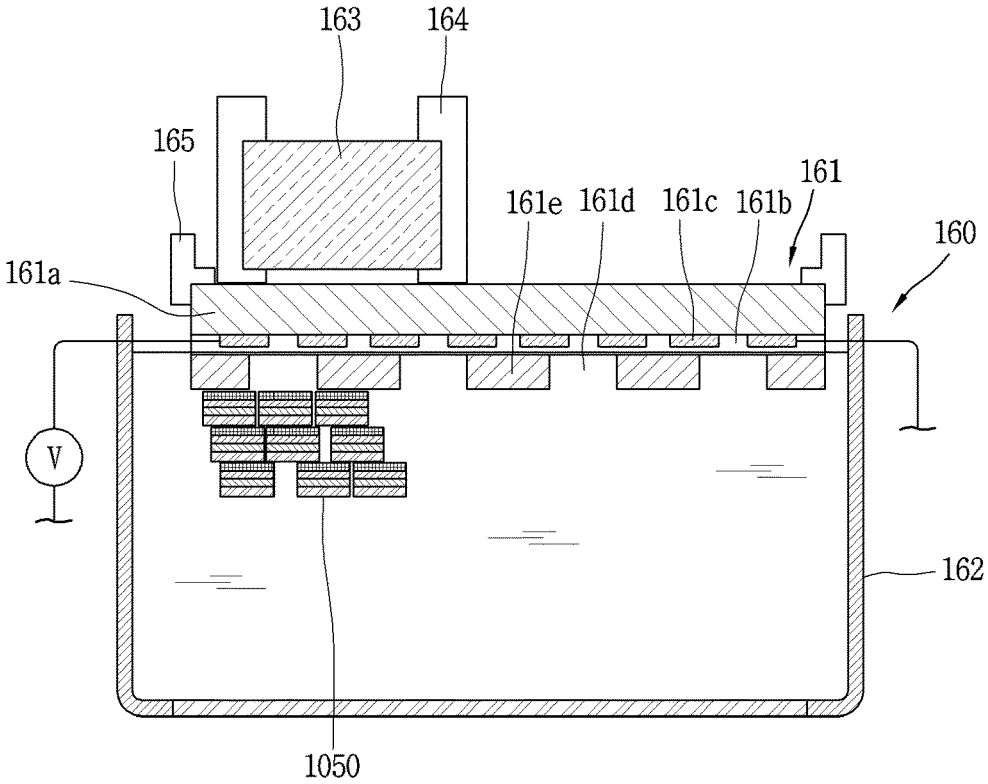

Next, magnetic force may be applied to the semiconductor light-emitting elements 1050 so that the semiconductor light-emitting elements 1050 in the fluid chamber 162 come up to the surface (FIG. 8B).

When the magnet 163 of the self-assembly device moves to the opposite side of the assembly surface of the substrate 161 from its original position, the semiconductor light-emitting elements 1050 may float in the fluid towards the substrate 161. The original position may refer to s position at which the magnet 163 is outside the fluid chamber 162. As another example, the magnet 163 may be configured as an electromagnet. In this case, an initial magnetic force may be generated by supplying electricity to the electromagnet.

Meanwhile, in this embodiment, the spacing between the assembly surface of the substrate 161 and the semiconductor light-emitting elements 1050 may be controlled by adjusting strength of the magnetic force. For example, the spacing may be controlled by using weight, buoyancy, and magnetic force of the semiconductor light-emitting elements 1050. The spacing may be several millimeters to several tens of micrometers from the outermost part of the substrate 161.

Figure 8C:
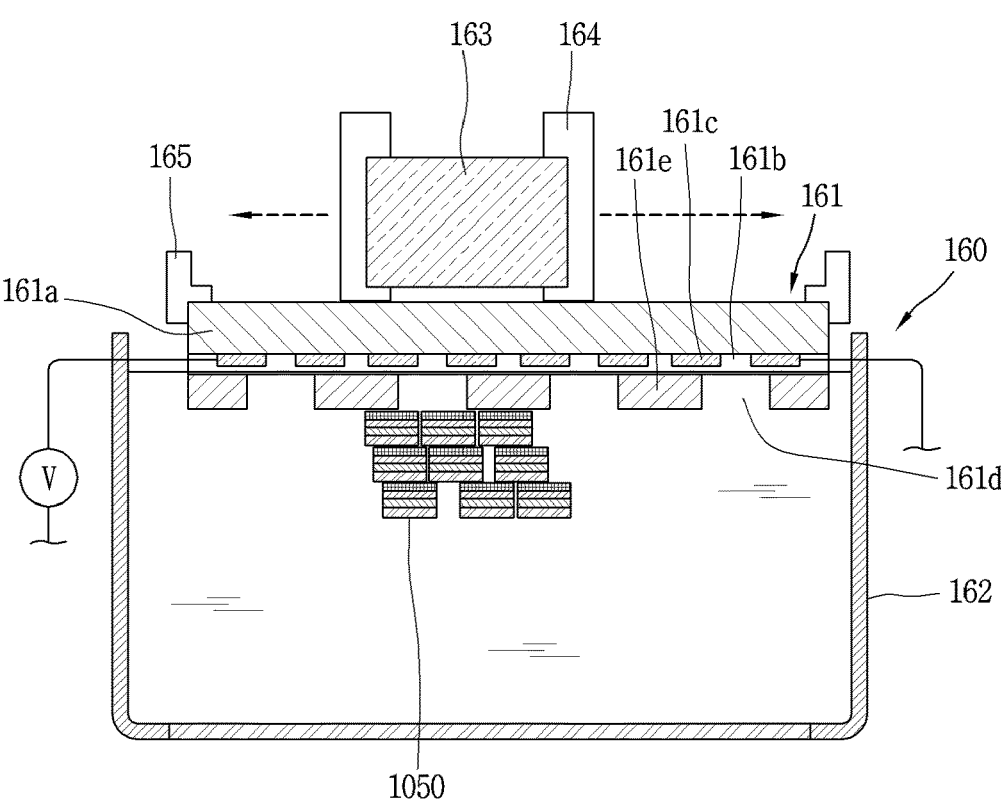

Next, magnetic force may be applied to the semiconductor light-emitting elements 1050 so that the semiconductor light-emitting elements 1050 can move in one direction within the fluid chamber 162. For example, the magnet 163 may move in a horizontal direction to the substrate, a clockwise direction, or a counterclockwise direction (FIG. 8C). In this case, the semiconductor light-emitting elements 1050 may be moved horizontally with respect to the substrate 161 by the magnetic force, with being spaced apart from the substrate 161.

Next, the semiconductor light-emitting elements 1050 may be guided to preset positions on the substrate 161 by applying an electric field so that the semiconductor light-emitting elements 1050 are mounted at the preset positions during their movement (FIG. 8C). For example, the semiconductor light-emitting elements 1050 may be moved vertically with respect to the substrate 161 by the electric field while being moved horizontally with respect to the substrate 161, thereby being placed at the preset positions of the substrate 161.

More specifically, an electric field may be generated by supplying power to bi-planar electrodes on the substrate 161, and the semiconductor light-emitting electrodes 1050 may be guided to be assembled only at the preset positions by the electric field. That is, the semiconductor light-emitting elements 1050 may be self-assembled at the assembly site on the substrate 161 by a selectively generated electric field. To this end, the substrate 161 may be provided with cells into which the semiconductor light-emitting elements 1050 are fitted.

Afterwards, unloading of the substrate 161 may be performed, thereby completing the assembly process. In a case where the substrate 161 is an assembly substrate, the assembled semiconductor light-emitting elements may be transferred onto a wiring substrate to carry out a subsequent process for realizing the display device, as described previously.

Figure 8D:
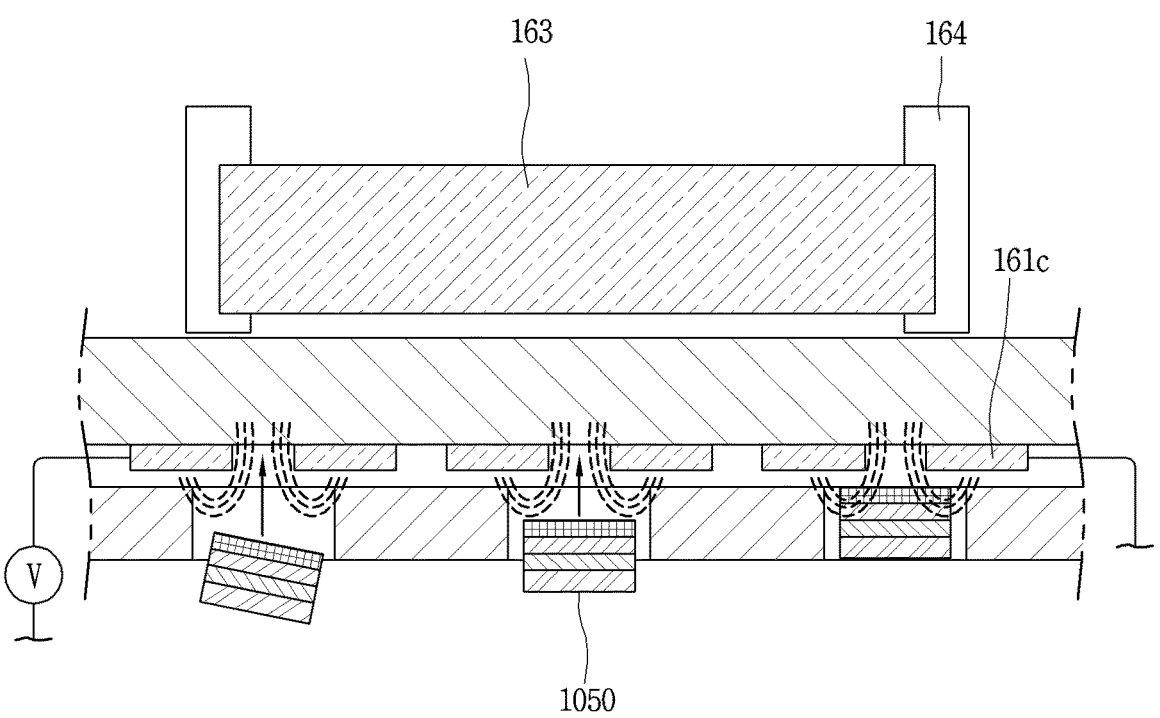
Figure 8E:
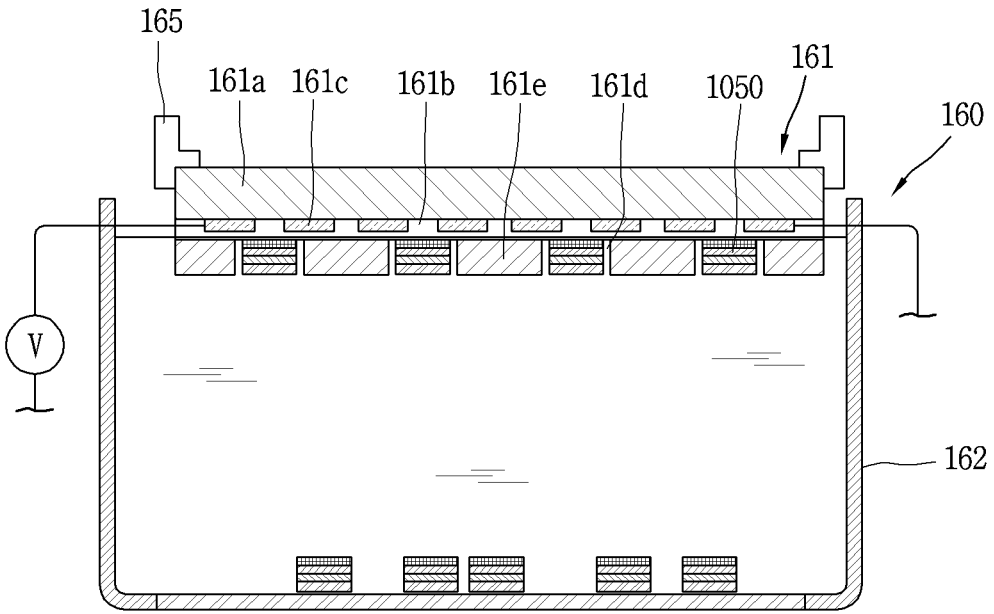

Meanwhile, after the semiconductor light-emitting elements 1050 are guided to the preset positions, the magnet 163 may be moved away from the substrate 161 such that the semiconductor light-emitting elements 1050 remaining in the fluid chamber 162 fall to the bottom of the fluid chamber 162 (FIG. 8D). In another example, when power supply is stopped in a case where the magnet 163 is an electromagnet, the semiconductor light-emitting elements 1050 remaining in the fluid chamber 162 may fall to the bottom of the fluid chamber 162.

Thereafter, the semiconductor light-emitting elements 1050 on the bottom of the fluid chamber 162 may be collected, and the collected semiconductor light-emitting elements 1050 may be re-used.

In the above-explained self-assembly device and method, parts at far distances may be concentrated near a preset assembly site by using a magnetic field in order to increase assembly yields in a fluidic assembly, and guided to be selectively assembled only at the assembly site by applying an electric field to the assembly site. In this case, the assembly substrate may be positioned on top of a water tank, with its assembly surface facing downward, thereby minimizing the effect of gravity from the weights of the parts and avoiding non-specific binding and eliminating defects. That is, the assembly substrate may be placed on the top to increase transfer yields, thus minimizing the effect of gravity or friction and avoiding non-specific binding.

As seen from above, with the configuration, a large number of semiconductor light-emitting elements can be assembled at a time in a display device where individual pixels are made up of semiconductor light-emitting elements.

As such, a large number of semiconductor light-emitting elements can be pixelated on a small-sized wafer and then transferred onto a large-area substrate. This enables the manufacture of a large-area display device at a low cost.

Meanwhile, the present disclosure provides a structure and method of an assembly substrate for increasing the yields of the self-assembly process and the process yields after the self-assembly. The present disclosure is limited to a case where the substrate 161 is used as an assembly substrate. That is, the assembly substrate to be described later is not used as the wiring substrate of the display device. Hereinafter, the substrate 161 is referred to as an assembly substrate 161.

The present disclosure improves the process yields in two aspects. First, the present disclosure prevents semiconductor light-emitting elements from being mounted on undesired positions due to an electric field strongly formed at the undesired positions. Second, the present disclosure prevents the semiconductor light-emitting elements from remaining on the assembly substrate when transferring the semiconductor light-emitting elements mounted on the assembly substrate to another substrate.

The above-mentioned objectives are not individually achieved by different components. The above-described two objectives can be achieved by organic coupling of components to be described later and the assembly substrate 161 described above.

Before describing the present disclosure in detail, a postprocess for manufacturing a display device after self-assembling will be described.

Figure 10A:
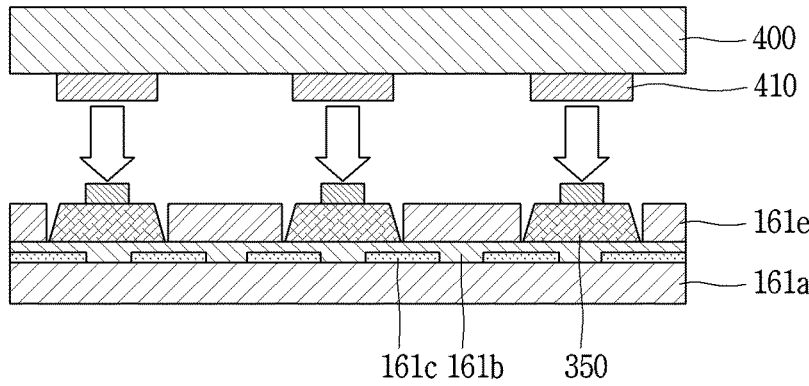
FIGS. 10A to 10C are conceptual views illustrating another transfer process of semiconductor light-emitting elements after a self-assembly process according to the present disclosure.
Figure 10B:
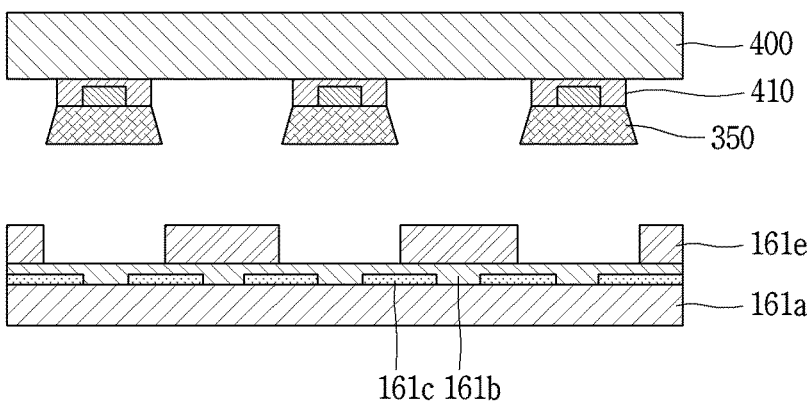
Figure 10C:
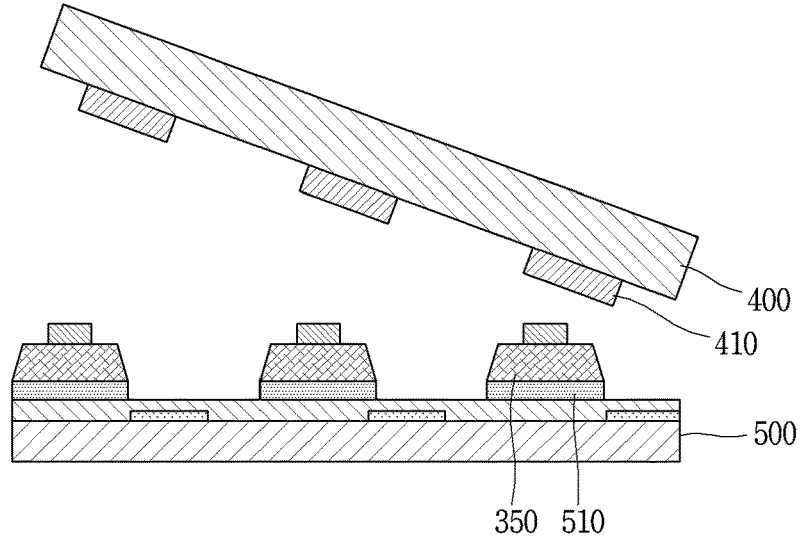

FIGS. 10A to 10C are conceptual diagrams illustrating a state in which the semiconductor light-emitting elements are transferred after a self-assembling process according to the present disclosure.

When the self-assembly process described with reference to FIGS. 8A to 8E is completed, the semiconductor light-emitting elements are mounted on the assembly substrate 161 at preset positions. The semiconductor light-emitting elements mounted on the assembly substrate 161 are transferred at least once to another substrate. This specification illustrates one embodiment in which the semiconductor light-emitting elements mounted on the assembly substrate 161 are transferred twice, but the present disclosure is not limited thereto. The semiconductor light-emitting elements mounted on the assembly substrate 161 may be transferred to another substrate once or three times or more.

On the other hand, immediately after the self-assembly process is completed, the assembly surface of the assembly substrate 161 faces downwards (or the gravity direction). For the process after the self-assembly, the assembly substrate 161 may be turned by 180 degrees with the semiconductor light-emitting elements mounted thereon. In this process, there is a risk that the semiconductor light-emitting elements are likely to be separated from the assembly substrate 161. Therefore, a voltage must be applied to the plurality of electrodes 161c (hereinafter, referred to as assembly electrodes) while the assembly substrate 161 is turned. An electric field formed between the assembly electrodes prevents the semiconductor light-emitting elements from being separated from the assembly substrate 161 while the assembly substrate 161 is turned.

When the assembly substrate 161 is turned by 180 degrees after the self-assembly process, a shape as shown in FIG. 10A is made. Specifically, as shown in FIG. 10A, the assembly surface of the assembly substrate 161 is in a state of facing upwards (or the opposite direction to gravity). In this state, a transfer substrate 400 is aligned above the assembly substrate 161.

The transfer substrate 400 is a substrate for separating the semiconductor light-emitting elements placed on the assembly substrate 161 and transferring them to the wiring substrate. The transfer substrate 400 may be formed of PDMS (polydimethylsiloxane). Accordingly, the transfer substrate 400 may be referred to as a PDMS substrate.

The transfer substrate 400 is aligned above the assembly substrate 161 and then pressed onto the assembly substrate 161. When the transfer substrate 400 is fed above the assembly substrate 161, the semiconductor light-emitting elements 350 mounted on the assembly substrate 161 are transferred to the transfer substrate 400 by the adhesive force of the transfer substrate 400.

To this end, surface energy between the semiconductor light-emitting elements 350 and the transfer substrate 400 should be higher than surface energy between the semiconductor light-emitting elements 350 and the dielectric layer 161b. When there is a greater difference between the surface energy between the semiconductor light-emitting elements 350 and the transfer substrate 400 and the surface energy between the semiconductor light-emitting elements 350 and the dielectric layer 161b, the probability that the semiconductor light-emitting elements 350 are separated from the assembly substrate 161 is more increased. Therefore, it is preferable that the difference between the two surface energies is great.

Meanwhile, the transfer substrate 40 may include a plurality of protrusions 410 that allow pressure applied by the transfer substrate 400 to be concentrated on the semiconductor light-emitting elements 350 when pressing the transfer substrate 400 onto the assembly substrate 161. The protrusions 410 may be formed at the same interval as the semiconductor light-emitting elements mounted on the assembly substrate 161. When the transfer substrate 400 is pressed onto the assembly substrate 161 after the protrusions 410 are aligned to overlap the semiconductor light-emitting elements 350, the pressure applied by the transfer substrate 400 can be concentrated only on the semiconductor light-emitting elements 350. Thus, the present disclosure increases the probability that the semiconductor light-emitting elements are separated from the assembly substrate 161.

Meanwhile, in a state where the semiconductor light-emitting elements are mounted on the assembly substrate 161, parts of the semiconductor light-emitting elements are preferably exposed to the outside of recesses. If the semiconductor light-emitting elements 350 are not exposed to the outside of the recesses, the pressure applied by the transfer substrate 400 is not concentrated on the semiconductor light-emitting elements 350, which may lower the probability that the semiconductor light-emitting elements 350 are separated from the assembly substrate 161.

Lastly, referring to FIG. 10C, the step of pressing the transfer substrate 400 onto the wiring substrate 500 and transferring the semiconductor light-emitting elements 350 from the transfer substrate 400 to the wiring substrate 500 is carried out. At this time, the wiring substrate 500 may be provided with protrusions 510. The transfer substrate 400 and the wiring substrate 500 are aligned so that the semiconductor light-emitting elements 350 disposed on the transfer substrate 400 overlap the protrusions 510. Thereafter, when the transfer substrate 400 is pressed onto the wiring substrate 500, the probability that the semiconductor light-emitting elements 350 are separated from the transfer substrate 400 may increase due to the protrusions 510.

On the other hand, in order for the semiconductor light-emitting elements 350 disposed on the transfer substrate 400 to be transferred to the wiring substrate 500, surface energy between the semiconductor light-emitting elements 350 and the wiring substrate 500 should be higher than surface energy between the semiconductor light-emitting elements 350 and the transfer substrate 400. When there is a greater difference between the surface energy between the semiconductor light-emitting elements 350 and the wiring substrate 500 and the surface energy between the semiconductor light-emitting elements 350 and the transfer substrate 400, the probability that the semiconductor light-emitting elements 350 are separated from the transfer substrate 400 is more increased. Therefore, it is preferable that the difference between the two surface energies is great.

After all the semiconductor light-emitting elements 350 disposed on the transfer substrate 400 are transferred onto the wiring substrate 500, the step of establishing electrical connection between the semiconductor light-emitting elements 350 and wiring electrodes provided on the wiring substrate may be performed. The structure of the wiring electrodes and the method of establishing the electrical connection may vary depending on the type of the semiconductor light-emitting elements 350.

Although not shown, an anisotropic conductive film may be disposed on the wiring substrate 500. In this case, the electrical connection can be established between the semiconductor light-emitting elements 350 and the wiring electrodes formed on the wiring substrate 500, simply by pressing the transfer substrate 400 onto the wiring substrate 500.

On the other hand, when manufacturing a display device including semiconductor light-emitting elements emitting light of different colors, the method described in FIGS. 10A to 10C can be implemented in various ways. Hereinafter, a method for manufacturing a display device including semiconductor light-emitting elements that emit red (R), green (G), and blue (B) light will be described.

Figure 11:
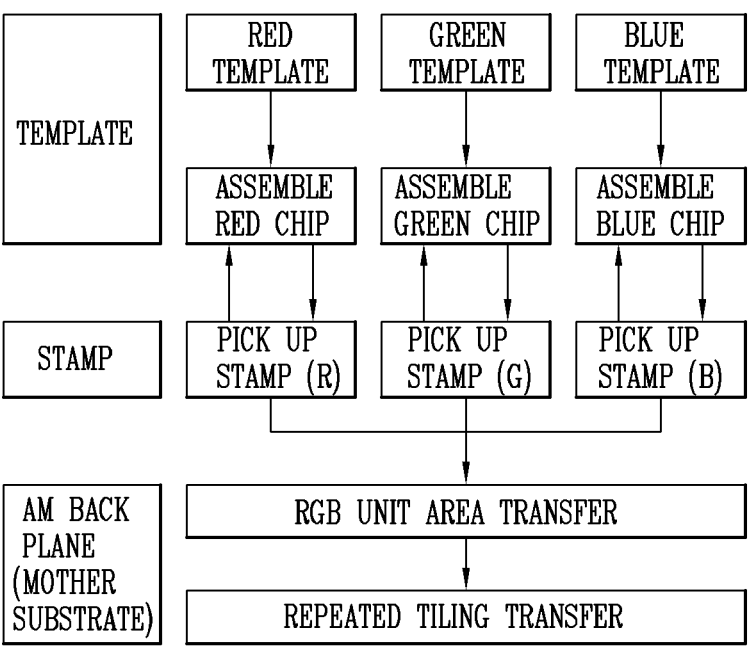
FIGS. 11 to 13 are flowcharts illustrating a method for manufacturing a display device including semiconductor light-emitting elements that emit red (R), green (G), and blue (B) light.
Figure 12:
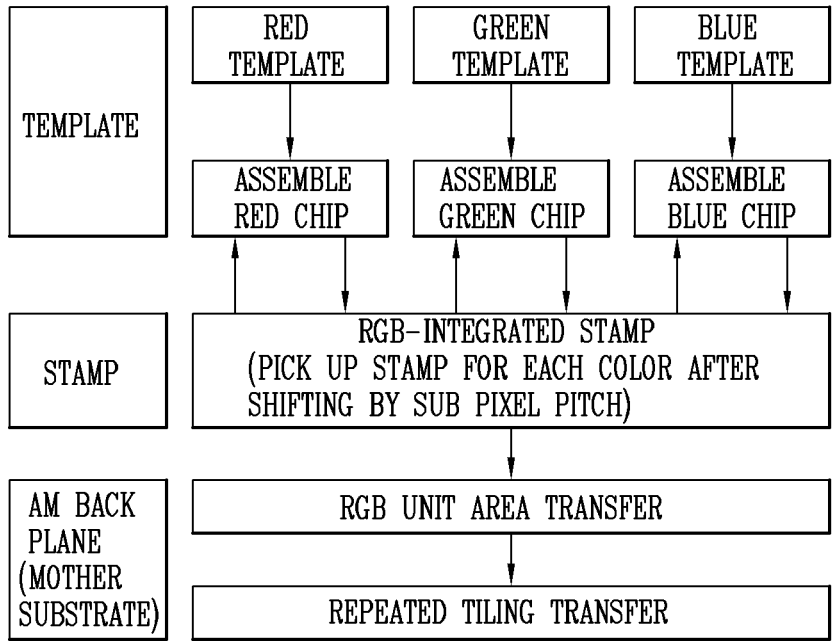
Figure 13:
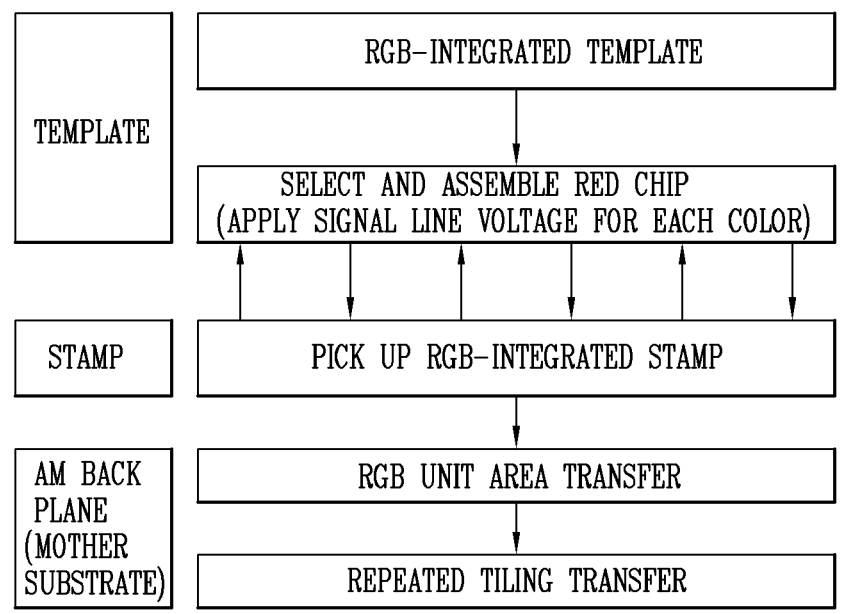

FIGS. 11 to 13 are flowcharts illustrating a method for manufacturing a display device including semiconductor light-emitting elements that emit red (R), green (G), and blue (B) light.

semiconductor light-emitting elements emitting light of different colors may be individually assembled to different assembly substrates. Specifically, the assembly substrate 161 may include a first assembly substrate on which semiconductor light-emitting elements emitting light of a first color are mounted, a second assembly substrate on which semiconductor light-emitting elements emitting light of a second color different from the first color are mounted, and a third assembly substrate on which semiconductor light-emitting elements emitting light of a third color different from the first color and the second color are mounted. Different kinds of semiconductor light-emitting elements are assembled to assembly substrates, respectively, according to the method described in FIGS. 8A to 8E. For example, semiconductor light-emitting elements emitting red (R), green (G), and blue (B) light may be assembled to the first to third assemble substrates, respectively.

Referring to FIG. 11, a RED chip, a GREEN chip, and a BLUE chip may be assembled respectively to first to third assembly substrates RED TEMPLATE, GREEN TEMPLATE, and BLUE TEMPLATE. In this state, the RED chip, GREEN chip and BLUE chip may be transferred to the wiring substrate by different transfer substrates, respectively.

Specifically, the step of transferring the semiconductor light-emitting elements, which are mounted on the assembly substrate, to the wiring substrate may include pressing a first transfer substrate (stamp R) onto the first assembly substrate RED TEMPLATE to transfer the semiconductor light-emitting elements (RED chip) emitting the light of first color from the first assembly substrate RED TEMPLATE to the first transfer substrate (stamp R), pressing a second transfer substrate (stamp G) onto the second assembly substrate GREEN TEMPLATE to transfer semiconductor light-emitting elements (GREEN chip) emitting the light of second color from the second assembly substrate GREEN TEMPLATE to the second transfer substrate (stamp G), and pressing a third transfer substrate (stamp B) onto the third assembly substrate BLUE TEMPLATE to transfer semiconductor light-emitting elements (BLUE chip) emitting the light of third color from the third assembly substrate BLUE TEMPLATE to the third transfer substrate (stamp B).

Thereafter, the step of pressing the respective first to third transfer substrates onto the wiring substrate to transfer the semiconductor light-emitting elements emitting the light of first to third colors from the first to third transfer substrates to the wiring substrate, respectively.

According to the manufacturing method according to FIG. 11, three types of assembly substrates and three types of transfer substrates are required to manufacture a display device including a RED chip, a GREEN chip, and a BLUE chip.

On the contrary, referring to FIG. 12, the RED chip, the GREEN chip, and the BLUE chip may be assembled to the first to third assembly substrates RED TEMPLATE, GREEN TEMPLATE, and BLUE TEMPLATE, respectively. In this state, the RED chip, GREEN chip and BLUE chip may be transferred to the wiring substrate by the same transfer substrate.

Specifically, the step of transferring the semiconductor light-emitting elements, which are mounted on the assembly substrate, to the wiring substrate may include pressing a transfer substrate (RGB integrated stamp) onto the first assembly substrate RED TEMPLATE to transfer the semiconductor light-emitting elements (RED chip) emitting the light of first color from the first assembly substrate RED TEMPLATE to the transfer substrate (RGB integrated stamp), pressing the transfer substrate (RGB integrated stamp) onto the second assembly substrate GREEN TEMPLATE to transfer semiconductor light-emitting elements (GREEN chip) emitting the light of second color from the second assembly substrate GREEN TEMPLATE to the transfer substrate (RGB integrated stamp), and pressing the transfer substrate (RGB integrated stamp) onto the third assembly substrate BLUE TEMPLATE to transfer semiconductor light-emitting elements (BLUE chip) emitting the light of third color from the third assembly substrate BLUE TEMPLATE to the transfer substrate (RGB integrated stamp).

In this case, the alignment positions between each of the first to third assembly substrates and the transfer substrate may be different from each other. For example, when the alignment between the assembly substrates and the transfer substrate is completed, the relative position of the transfer substrate with respect to the first assembly substrate and the relative position of the transfer substrate with respect to the second assembly substrate may be different from each other. The transfer substrate may be shifted in its alignment position by a pitch of a sub pixel every time the type of the assembly substrate is changed. In this way, when the transfer substrate is sequentially pressed onto the first to third assembly substrates, all the three kinds of chips can be transferred to the transfer substrate.

Afterwards, similar to FIG. 11, the step of pressing the transfer substrate onto the wiring substrate to transfer the semiconductor light-emitting elements emitting the light of first to third colors from the transfer substrate to the wiring substrate is performed.

According to the manufacturing method illustrated in FIG. 12, three types of assembly substrates and one type of transfer substrate are required to manufacture a display device including an RED chip, a GREEN chip, and a BLUE chip.

Unlike FIGS. 11 and 12, according to FIG. 13, a RED chip, a GREEN chip, and a BLUE chip may be assembled onto one assembly substrate (RGB integrated TEMPLATE). In this state, each of the RED chip, GREEN chip and BLUE chip can be transferred to the wiring substrate by the same transfer substrate (RGB integrated stamp).

According to the manufacturing method illustrated in FIG. 13, one type of assembly substrate and one type of transfer substrate are required to manufacture a display device including an RED chip, a GREEN chip, and a BLUE chip.

As described above, when manufacturing a display device including semiconductor light-emitting elements emitting light of different colors, the manufacturing method may be implemented in various ways.

On the other hand, a transfer technology is a key to the commercialization of large-scale display devices using semiconductor light-emitting elements having a size of several to several tens of μm.

In the related art, in order to reduce manufacturing costs, semiconductor light-emitting elements are fabricated at maximum density on one growth substrate and then selectively transferred to a substrate through a laser lift-off method (LLO). Recently, as described above, a self-assembly method using dielectrophoretic force (DEP force) is being developed.

As a self-assembly method, there is a method of transferring semiconductor light-emitting elements directly to a wiring substrate or transferring semiconductor light-emitting elements to an assembly substrate and then finally transferring them to a wiring substrate through an additional transfer process using a transfer stamp. Compared to the related art transfer method, any of those methods has an advantage in that semiconductor light-emitting elements can be transferred to a large-scale substrate at high speed.

However, when manufacturing a display device using semiconductor light-emitting elements having a size of several to several tens of μm, it is important to secure a transfer yield of a certain level or higher because millions or more semiconductor light-emitting elements are required.

For example, when semiconductor light-emitting elements are directly transferred to a wiring substrate, sufficient adhesive strength has to be secured between the wiring substrate and the semiconductor light-emitting elements in order to prevent the semiconductor light-emitting elements transferred to the substrate through self-assembly from being lost through subsequent processes.

In addition, when the semiconductor light-emitting elements are transferred to an assembly substrate, surface energy between the assembly substrate and a transfer stamp must be controlled so that the semiconductor light-emitting elements can be transferred from the assembly substrate to the transfer stamp.

The present disclosure is to solve the above problems, and relates to a display device designed to improve a transfer yield of semiconductor light-emitting elements in a method of self-assembling semiconductor light-emitting elements directly on a wiring substrate.

Hereinafter, a method of manufacturing a display device according to the present disclosure will be described with reference to the accompanying drawings.

In this specification, a driving method of a display device described herein is not particularly limited, and the display device may be driven by a passive matrix (PM) method or an active matrix (AM) method.

Figure 14:
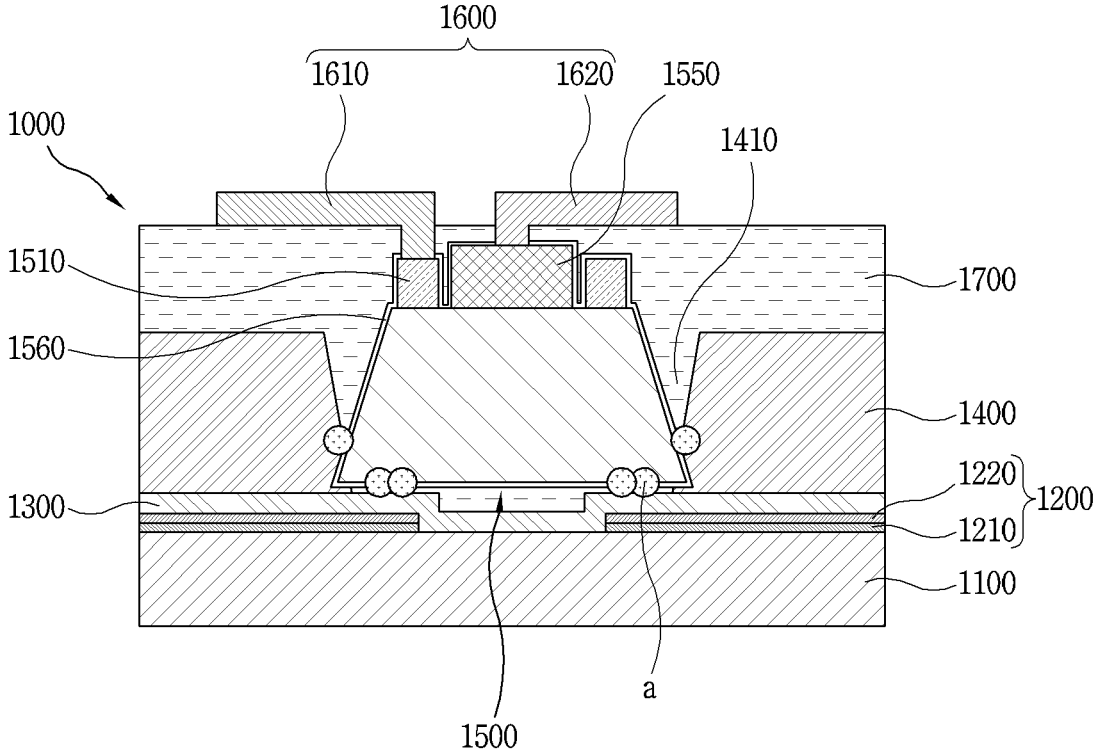
FIG. 14 is a conceptual view illustrating a structure (pixel portion) of a display device according to the present disclosure.
Figure 15A:
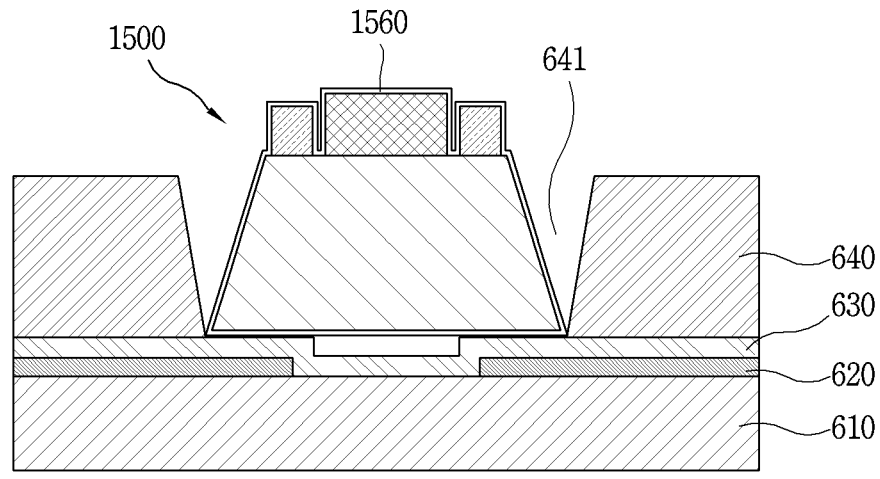
FIG. 15A is a conceptual view illustrating an inside of a hole of the related art substrate.
Figure 15B:
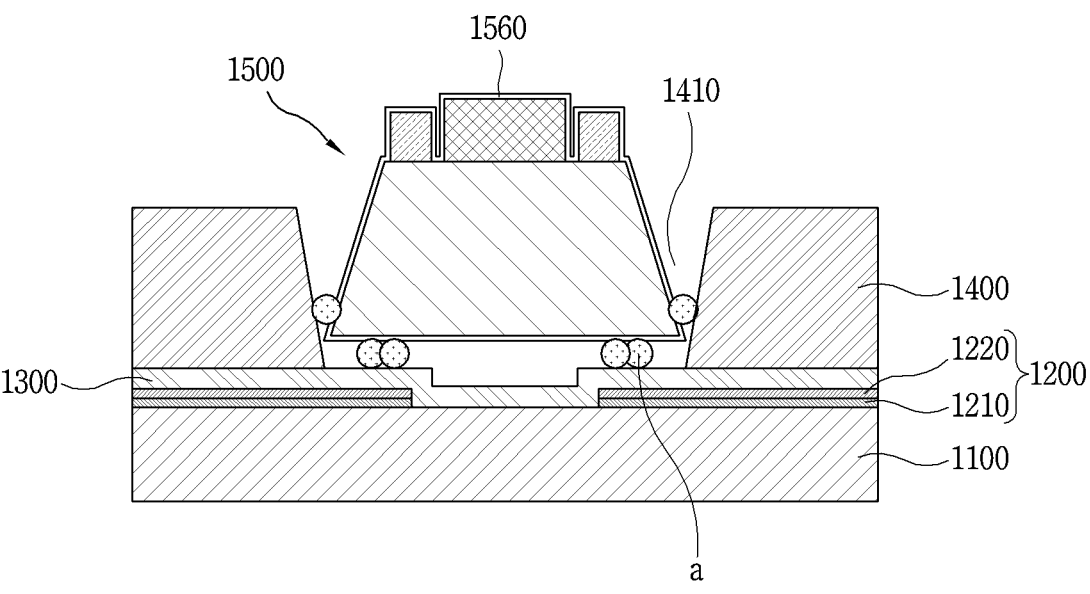
FIG. 15B is a conceptual view illustrating an inside of a hole of a substrate according to the present disclosure.

FIG. 14 is a conceptual view illustrating a structure (pixel portion) of a display device according to the present disclosure, FIG. 15A is a conceptual view illustrating an inside of a hole of the related art substrate, and FIG. 15B is a conceptual view illustrating an inside of a hole of a substrate according to the present disclosure.

Referring to FIG. 14, a display device 1000 according to the present disclosure may include a base 1100, assembly electrodes 1200, a dielectric layer 1300, a barrier rib 1400, semiconductor light-emitting elements 1500, wiring electrodes 1600, and a planarization layer 1700.

First, the base 1100 may be a wiring substrate on which the wiring electrodes 1600 are disposed. The base 1100 may be formed of an insulating and flexible material, for example, polyimide (PI), to realize flexibility. However, the present disclosure is not limited thereto, and any insulating and flexible material may be used as the material of the base 1100.

The assembly electrodes 1200 may be formed (or disposed) on the base 1100. The assembly electrodes 1200 may be bar-shaped electrodes extending in one direction. The assembly electrodes 1200 are provided for self-assembling the semiconductor light-emitting element 1500, and may be distinguished from the wiring electrodes 1600 for turning on and off the semiconductor light-emitting element 1500.

A voltage for forming an electric field may be applied to the assembly electrodes 1200 during self-assembly. Therefore, the assembly electrodes 1200 may be formed of a non-resistive metal or a material having excellent electrical conductivity so as to be advantageous in voltage transmission. For example, the assembly electrodes 1200 may be formed of a material such as Au, Ag, Cr, Ti, Al, Mo, Cu, or ITO.

On the other hand, among the materials that can constitute the assembly electrodes 1200, Al has a characteristic that is sensitive to electrochemical reactions. For example, Al may be easily oxidized to form adhesive $AlO_x$ under the conditions in which the electrochemical reaction of the present disclosure proceeds. Hereinafter, $AlO_x$ may mean aluminum oxide in the form of $Al_2O_3$.

The display device 1000 according to the present disclosure uses the characteristic of Al, and the assembly electrodes 1200 according to the present disclosure may be formed to contain Al. At this time, the meaning of being formed to contain Al may mean including both a case where the assembly electrode 1200 is formed of an Al material and a case where the assembly electrode 1200 is formed of an Al alloy material.

According to the present disclosure, the self-assembly process for manufacturing the display device 1000 may be performed in a fluid, and a predetermined voltage may be applied to the assembly electrodes 1200 during the self-assembly. Thus, when the assembly electrodes 1200 are formed to contain Al, the electrochemical reaction of Al may proceed to form $AlO_x$(a).

According to an embodiment of the present disclosure, each of the assembly electrodes 1200 may include a plurality of layers, and among the plurality of layers, a layer in contact with the dielectric layer 1300 to be described later may contain Al.

Specifically, in the related art, an assembly electrode 620 may include a plurality of layers, and among the plurality of layers, a layer in contact with a dielectric layer 630 may be formed of a material that is stable in an electrochemical reaction.

For example, the assembly electrode 620 may include two layers such as Al—Cr, Al—Ti, Al-ITO, etc., or three layers such as Mo—Al—Mo, Ti—Al—Mo, etc. Al, which is vulnerable to an electrochemical reaction, may form a layer that is not in contact with the dielectric layer 630. In this case, the layer in contact with the dielectric layer 630 may be formed of a material, such as Cr, Ti, ITO, etc., which are resistant to the electrochemical reaction, so that the electrochemical reaction of Al can be controlled during the self-assembly process (see FIG. 15A).

The assembly electrodes 620 having such a structure may be suitable as an assembly substrate structure used in a self-assembly method including the processes illustrated in FIGS. 10A to 10C. Since the assembly substrate used in the aforementioned self-assembly method should be repeatedly reusable in terms of process costs, chemical resistance should be considered when designing the substrate.

Meanwhile, according to the present disclosure, each of the assembly electrodes 1200 may include two layers 1210 and 1220 such as Mo—Al, Ti—Al, or the like, and the layer 1220 in contact with the dielectric layer 1300 may contain Al. When the self-assembly process proceeds in this structure, the layer containing Al among the layers of the assembly electrode 1200 may be corroded to elute Al ions. The Al ions may then react with the material constituting the dielectric layer 1300 to form $AlO_x(a)$ (see FIG. 15B).

The dielectric layer 1300 may be disposed to cover the assembly electrodes 1200 on the base 1100. The dielectric layer 1300 may protect the assembly electrodes 1200 from a fluid in which the self-assembly is performed.

According to one embodiment, the dielectric layer 1300 may be made of an $Al_2O_3$ material to have a thickness of 10 nm to 200 nm. In this way, in addition to the assembly electrodes 1200, when the dielectric layer 1300 is also formed to contain Al, it may be advantageous to form $AlO_x(a)$.

In another embodiment, the dielectric layer 1300 may be a porous layer made of $SiO_2$ or $SiN_x$. That is, according to the embodiment, the dielectric layer 1300 may be formed at a low density so that a fluid can penetrate. In addition, in this embodiment, the dielectric layer 1300 may be formed to have a thickness of 10 nm to 150 nm. The dielectric layer 1300 may have a refractive index of 1.4 or less when the dielectric layer 1300 is formed of $SiO_2$, while having a refractive index of 2.0 or less when the dielectric layer 1300 is made of $SiN_x$.

The barrier rib 1400 may be stacked on the dielectric layer 1400 while forming assembly holes 1410 to overlap the assembly electrodes 1200. The semiconductor light-emitting elements 1500 may be seated in the holes 1410 formed by the barrier rib 1400 through self-assembly. Accordingly, the barrier rib 1400 can serve to separate individual pixels. The barrier rib 1400 may be formed of an organic or inorganic insulating material and may be stacked on the dielectric layer 1300 to have a thickness of several hundred nm to several μm.

According to the present disclosure, the holes 1410 in which the semiconductor light-emitting elements 1500 are seated may contain $AlO_x(a)$ therein. $AlO_x(a)$ may be a by-product (salt) produced by an electrochemical reaction among materials constituting the assembly electrodes 1200 and/or the dielectric layer 1300 during the self-assembly process.

Accordingly, $AlO_x(a)$ may be produced between the semiconductor light-emitting element 1500 and the dielectric layer 1300 defining a bottom surface of the hole 1410 or between the semiconductor light-emitting element 1500 and the barrier rib 1400 defining a side surface of the hole 1410.

For example, each of the holes 1410 may contain $AlO_x$ that is produced in an island shape between the semiconductor light-emitting element 1500 and the dielectric layer 1300 and/or between the semiconductor light-emitting element 1500 and the barrier rib 1400 as illustrated in the drawing.

Also, $AlO_x(a)$ may be irregularly formed inside the holes 1410. That is, in each of the holes 1410, the number, location, size, and shape of $AlO_x(a)$ may all be different.

According to the present disclosure, since $AlO_x(a)$ generated as a by-product of the electrochemical reaction between the assembly electrodes 1200 and the dielectric layer 1300 has adhesiveness, it can serve to fix the semiconductor light-emitting elements 1500 seated inside the holes 1410. This can minimize the probability of loss of the semiconductor light-emitting elements 1500 during subsequent processes.

Meanwhile, adhesive strength of $AlO_x(a)$ may vary depending on the content of Al contained in the assembly electrodes 1200 and $Al_2O_3$ contained in the dielectric layer 1300.

The semiconductor light-emitting elements 1500 disposed inside the holes 1410 may have a structure to be self-assembled. Each of the semiconductor light-emitting elements 1500 may include a first conductive electrode 1510, a first conductive semiconductor layer 1520 on which the first conductive electrode 1510 is disposed, an active layer 1530 disposed on the first conductive semiconductor layer 1520, a second conductive semiconductor layer 1540 disposed on the active layer 1530, and a second conductive electrode 1550 disposed on the second conductive semiconductor layer 1540. In this way, the semiconductor light-emitting element 1500 may have a horizontal structure in which the first conductive electrode 1510 and the second conductive electrode 1550 face the same direction with respect to the first conductive semiconductor layer 1520. In this embodiment, the first conductive type may be an n-type and the second conductive type may be a p-type, or vice versa. Meanwhile, a detailed description of the semiconductor light-emitting element 1500 will be replaced with the foregoing description.

According to the present disclosure, the semiconductor light-emitting element 1500 may include a passivation layer 1560 formed along a surface of the semiconductor light-emitting element 1500 as a structure for self-assembly. The passivation layer 1560 can prevent corrosion of the first and second conductive electrodes 1510 and 1550 of the semiconductor light-emitting element 1500 during the self-assembly process. In addition, the passivation layer 1560 can prevent the wiring electrodes 1600, which will be described later, from being electrically connected to other regions except for the first and second conductive electrodes 1510 and 1550.

In addition, at least one of the first conductive electrode 1510 and the second conductive electrode 1550 of the semiconductor light-emitting element 1500 may include a magnetic substance to induce magnetic force during self-assembly. The magnetic substance may be a metal exhibiting magnetism, such as Ni or SmCo, and may be disposed in the form of particles or may form one layer constituting the first and second conductive electrodes 1510 and 1550.

In addition, the semiconductor light-emitting element 1500 may be formed to be symmetrical with respect to at least one direction in order to secure directional selectivity during self-assembly. Preferably, the semiconductor light-emitting element 1500 may be formed in a circular or elliptical shape.

The planarization layer 1700 may be formed to cover one surface of the semiconductor light-emitting element 1500 seated in the hole 1410. The planarization layer 1700 may be formed on the barrier rib 1400 to cover a top surface of the semiconductor light-emitting element 1500 while filling an empty space of the hole 1410. For example, the planarization layer 1700 may be a flexible and insulating material such as polyimide (PI). Alternatively, the planarization layer 1700 may be a photosensitive organic insulating layer, such as photosensitive acrylate or photo active compounds (PAC).

The planarization layer 1700 may include a first electrode hole 1710 exposing the first conductive electrode 1510 and a second electrode hole 1720 exposing the second conductive electrode 1550 of the semiconductor light-emitting element. Since the first electrode hole 1710 and the second electrode hole 1720 are formed through the passivation layer 1560 that covers the first conductive electrode 1510 and the second conductive electrode 1550 of the semiconductor light-emitting element, portions of the first conductive electrode 1510 and the second conductive electrode 1550 may be exposed through the first electrode hole 1710 and the second electrode hole 1720.

In addition, wiring electrodes 1600 electrically connected to the semiconductor light-emitting element 1500 seated in the hole 1410 may be disposed on the planarization layer 1700. The wiring electrodes 1600 may be electrically connected to the semiconductor light-emitting element 1500 through the first electrode hole 1710 and the second electrode hole 1720.

For example, the wiring electrodes 1600 may include a first electrode 1610 connected to the first conductive electrode 1510 of the semiconductor light-emitting element and a second electrode 1620 electrically connected to the second conductive electrode 1550. The first electrode 1610 may be electrically connected to the first conductive electrode 1510 through the first electrode hole 1710, and the second electrode 1620 may be electrically connected to the second conductive electrode 1550 through the second electrode hole 1720.

Meanwhile, the first electrode 1610 and the second electrode 1620 may be electrically insulated from each other by an insulating layer (not illustrated) on the planarization layer 1700. That is, the first electrode 1610 and the second electrode 1620 may be disposed on different planes so as not to be electrically connected to each other. Although the planarization layer 1700 is illustrated as a single layer in the drawing, it may be a concept including a plurality of insulating layers.

Next, a process of manufacturing a display device according to the present disclosure will be described.

Figure 16:
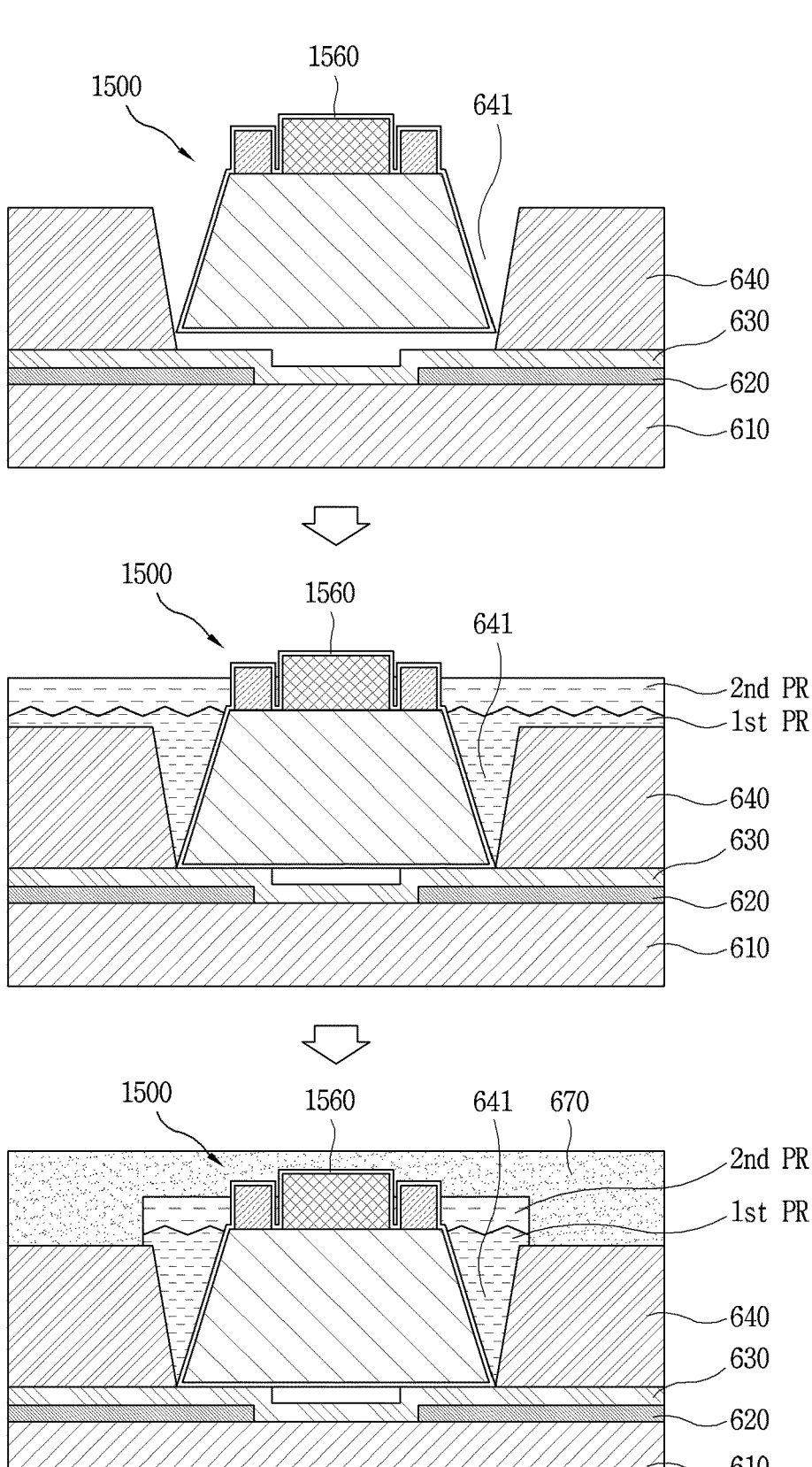
FIG. 16 is a conceptual view illustrating a process for fixing a semiconductor light-emitting element in a hole after self-assembly in a manufacturing process for the related art display device.
Figure 17A:
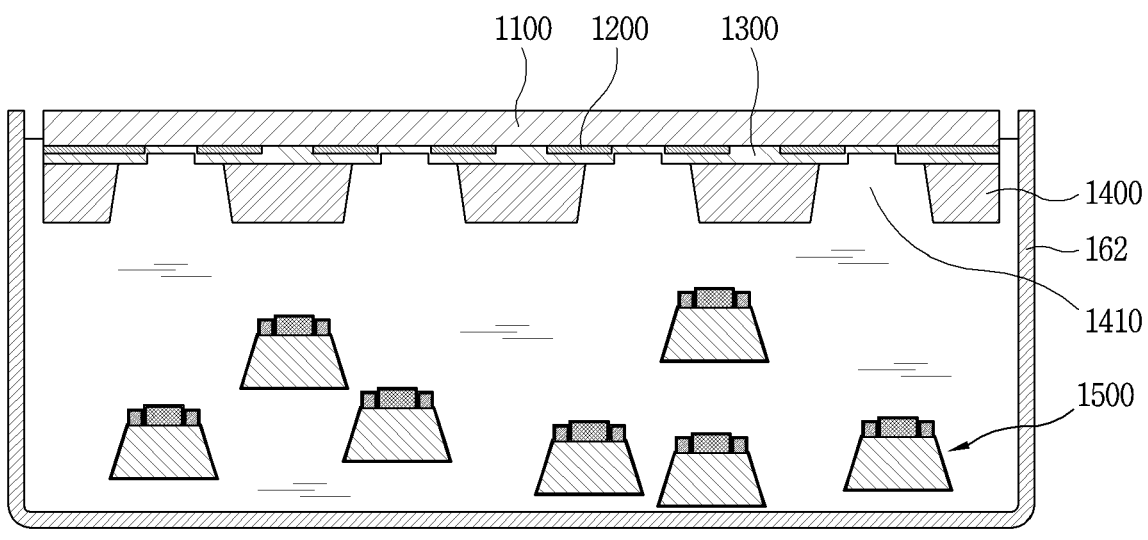
FIGS. 17A to 17F are conceptual views illustrating a process for manufacturing a display device according to the present disclosure.
Figure 17B:
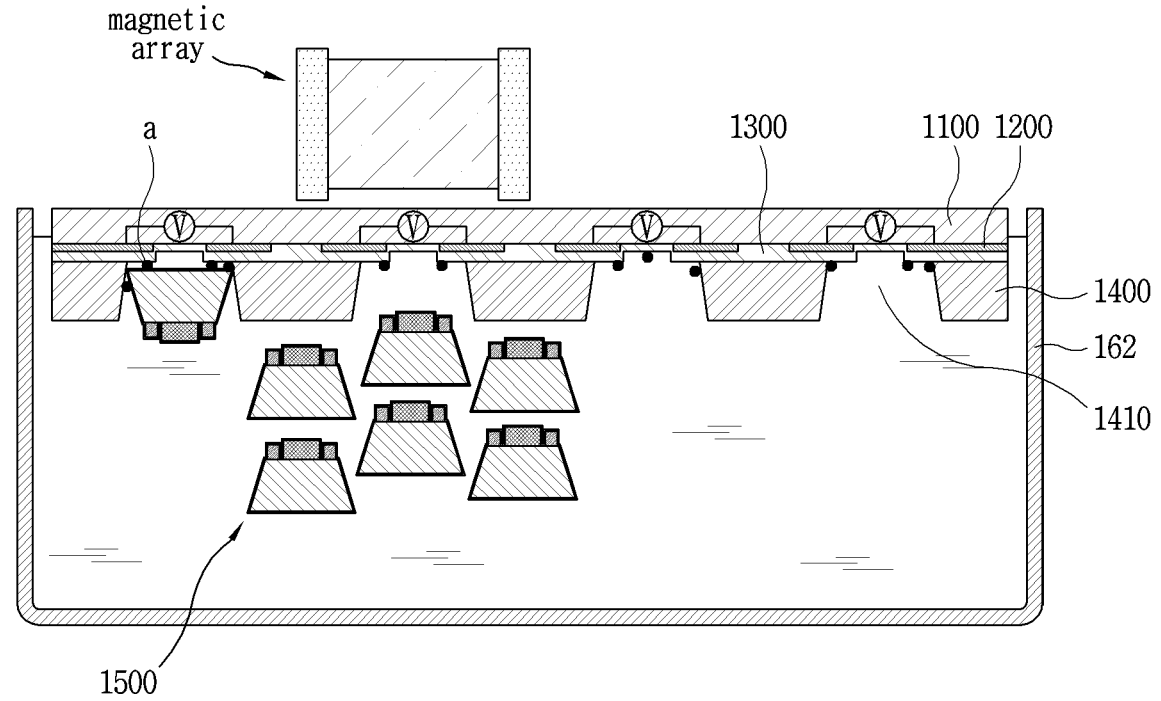
Figure 17C:
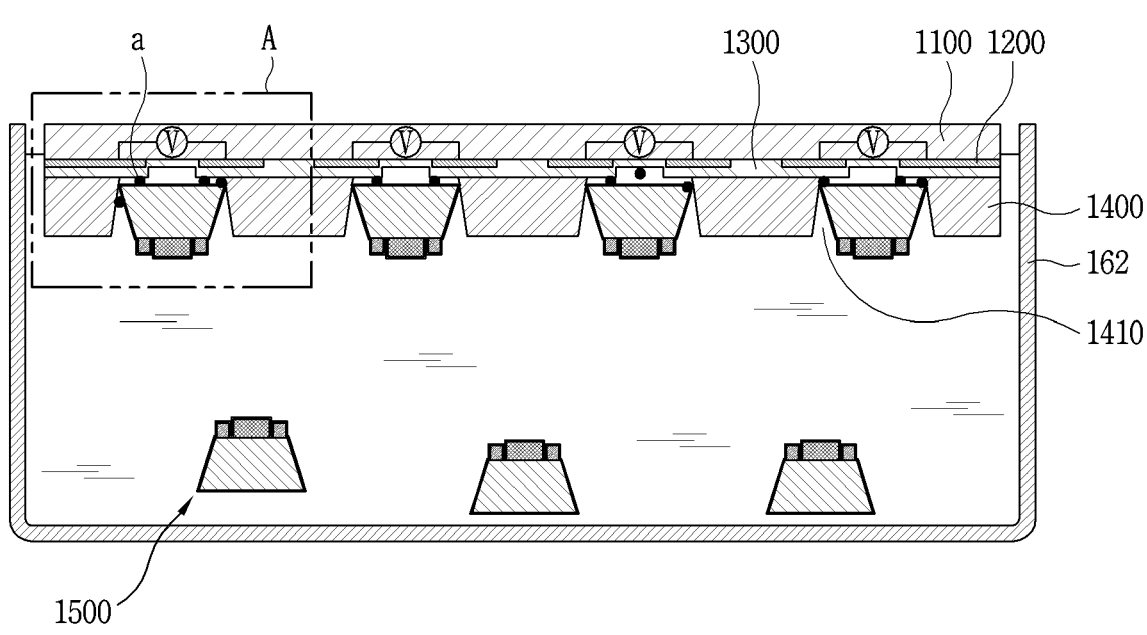
Figure 17D:
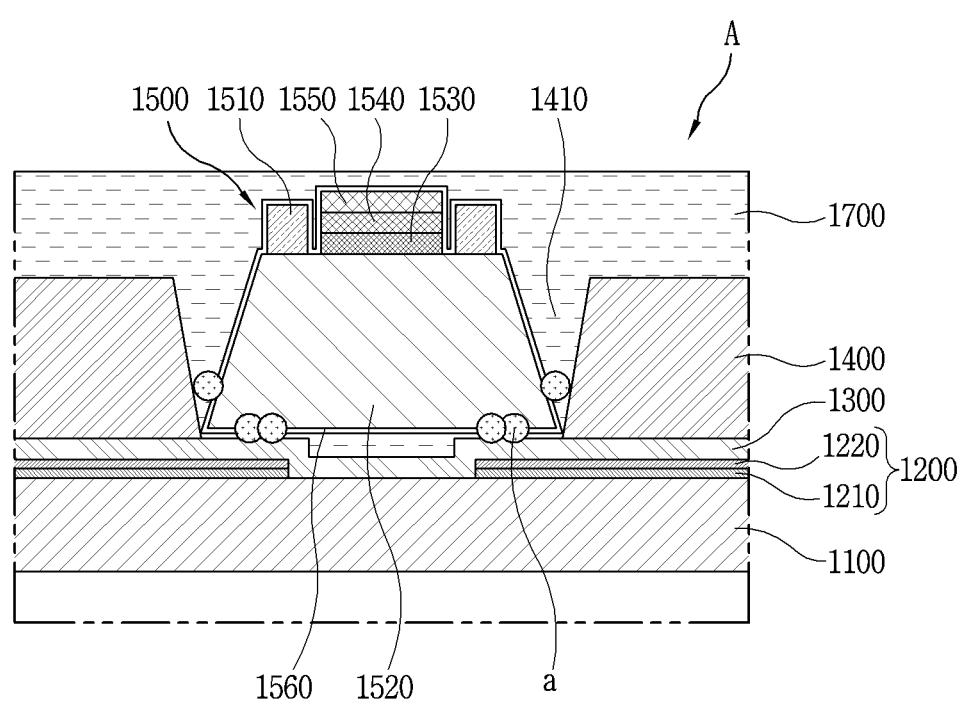
Figure 17E:
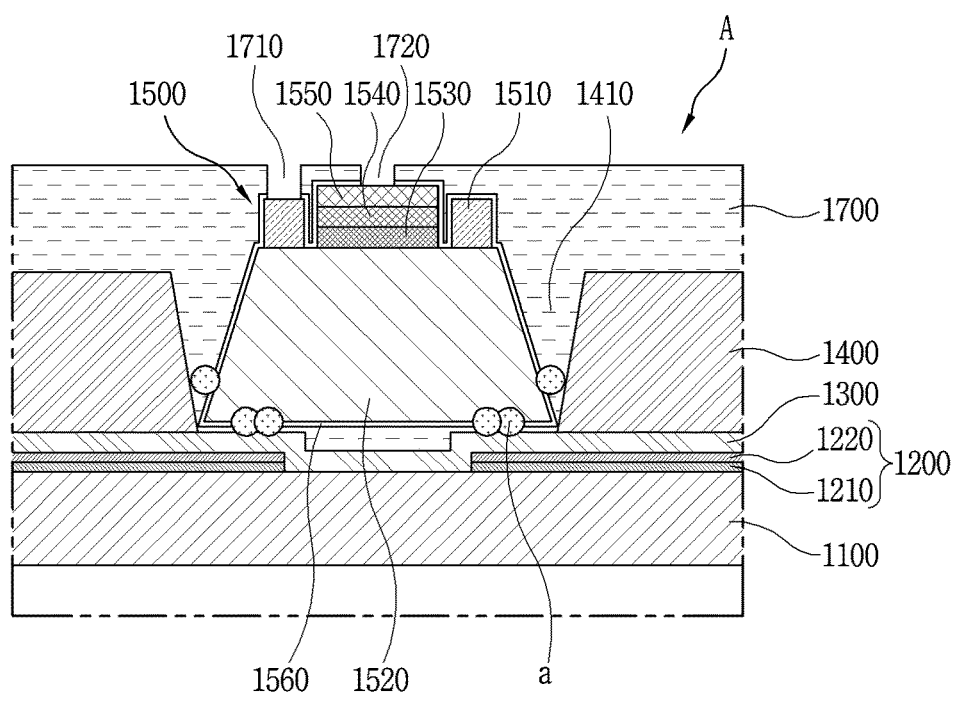
Figure 17F:
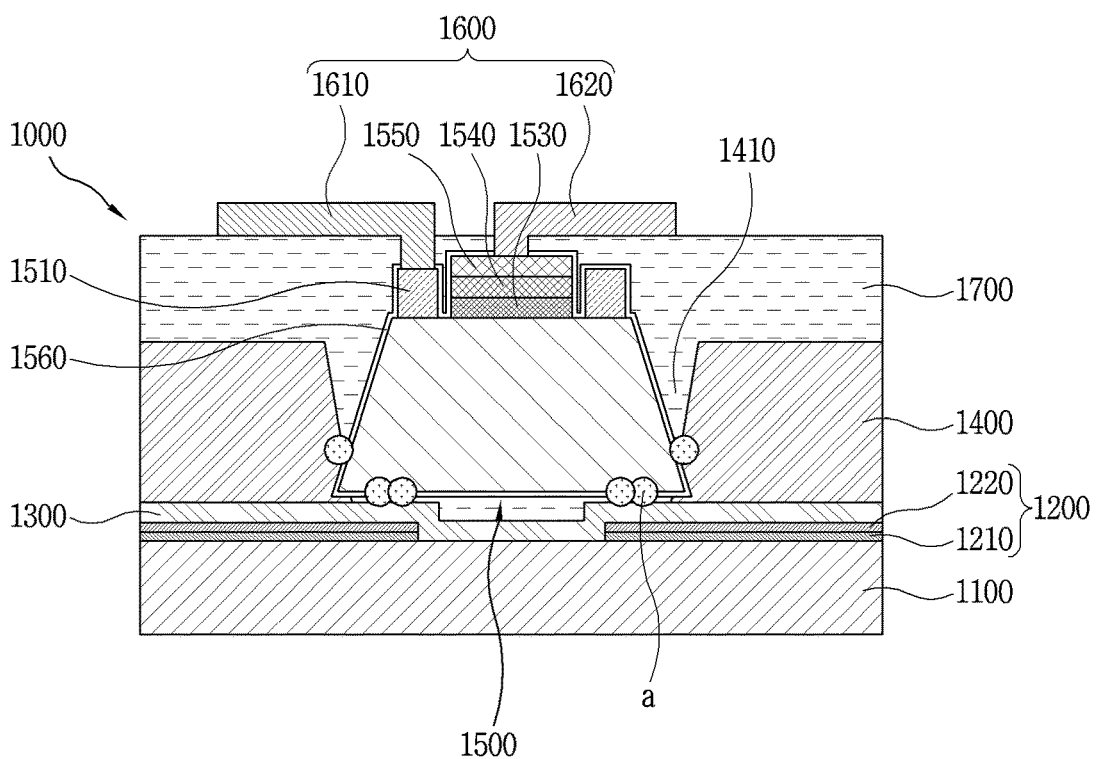

FIG. 16 is a conceptual view illustrating a process for fixing a semiconductor light-emitting element in a hole after self-assembly in a manufacturing process for the related art display device, and FIGS. 17A to 17F are conceptual views illustrating a process for manufacturing a display device according to the present disclosure.

To manufacture a display device 1000 according to the present disclosure, the self-assembly process illustrated in FIGS. 8A to 8E may be performed.

First, a step of putting semiconductor light-emitting elements 1500 according to the present disclosure into a chamber (or fluid chamber) 162 containing a fluid may be performed. Neutral (PH 7) DI water (de-ionized water) may be filled in the fluid chamber 162 to induce an electrochemical reaction during self-assembly. However, the present disclosure is not limited thereto, and the fluid chamber 162 may alternatively be filled with a weak acidic aqueous solution or a weak basic aqueous solution.

Next, a step of disposing a substrate including assembly electrodes 1200 on a top of the fluid chamber 162 may be performed. In this case, a surface of the substrate on which the assembly electrodes 1200 are formed may correspond to an assembly surface, and the substrate may be submerged in the fluid with the assembly surface facing a bottom surface of the fluid chamber 162. The substrate disposed on the top of the fluid chamber 162 may become a display device 1000 according to the present disclosure through processes to be described later. When the substrate is disposed on the top of the fluid chamber 162, the substrate may further include structures for self-assembly, electrodes other than the assembly electrodes depending on a type of a substrate, TFT, etc.

Specifically, the substrate may include a base 1100, assembly electrodes 1200, a dielectric layer 1300, and a barrier rib 1400, and also include holes 1410 that are segmented by the barrier rib 1400 such that the semiconductor light-emitting elements 1500 are seated therein.

The assembly electrodes 1200 formed in a bar-like shape extending in one direction may be disposed on the base 1100, and may be covered with the dielectric layer 1300.

The assembly electrodes 1200 may be formed on the base 1100 at predetermined distances, for example, at distances of 15 µm to 20 µm through a pattern forming process (photolithography process).

According to the present disclosure, the assembly electrodes 1200 may be formed to contain Al. Specifically, each of the assembly electrodes 1200 may include a plurality of layers, and among the plurality of layers, a layer in contact with a dielectric layer 1300 to be described later may contain Al.

The dielectric layer 1300 may be formed to have a thickness of several tens to several hundreds of nm through a process such as PVD or CVD, so as to cover the assembly electrodes 1200. According to the present disclosure, the dielectric layer 1300 may be made of an $Al_2O_3$ material, or may be a porous layer made of an $SiO_2$ or $SiN_x$ material.

The barrier rib 1400 may be stacked on the dielectric layer 1300 while forming holes 1410 in which the semiconductor light-emitting elements 1500 are to be seated. The barrier rib 1400 may be fabricated by depositing a polymer on the dielectric layer 1300 by a thickness of several hundred nm to several µm, and then forming a pattern for the plurality of holes 1410.

Next, a step of seating the semiconductor light-emitting elements 1500 at preset positions on the substrate using an electric field and a magnetic field may be performed. In this step, the semiconductor light-emitting elements 1500 may be placed inside the holes 1410.

In this step, a magnetic field may be applied through a magnet array provided on an opposite side of the assembly surface. In this case, in order to apply magnetic force to the semiconductor light-emitting elements 1500 submerged into the fluid chamber 162, a distance between one surface of the substrate (opposite side of the assembly surface) and the magnet array may be maintained within several mm.

Also, in this step, a predetermined voltage may be applied to the assembly electrodes 1200 to form an electric field on the assembly surface of the substrate. During this process, $AlO_x(a)$ may be produced inside the holes 1410 of the substrate.

$AlO_x(a)$ is a by-product formed as Al contained in the assembly electrodes 1200 and/or the dielectric layer 1300 is reduced in the fluid and has adhesive force. Thus, $AlO_x(a)$ can serve to fix the semiconductor light-emitting elements 1500 inside the holes 1410.

According to the present disclosure, a voltage of ±6V or higher may be applied to the assembly electrodes 1200 when the electric field is formed to produce $AlO_x(a)$ inside the holes 1410. That is, a voltage of at least ±6V should be applied to the assembly electrodes 1200, and a higher voltage may be applied depending on an area of the substrate.

When the self-assembly of the semiconductor light-emitting elements 1500 is completed, a step of turning over by 180 degrees the substrate that is disposed with its assembly surface facing the bottom surface of the fluid chamber 162, to form a planarization layer 1700 to cover the semiconductor light-emitting elements 1500 may be performed through a post-process.

Referring to FIG. 16, after self-assembly in the related art, a step of fixing the semiconductor light-emitting element 1500 assembled in the hole 641 was performed before forming the planarization layer 670. Specifically, photoresist (PR) was firstly sprayed on the barrier rib 640, secondarily coated on the PR-sprayed barrier rib 640 in a spinning manner, and then exposed to form a pattern for fixing the semiconductor light-emitting element 1500 inside or near the hole 641. After the process was completed, a step of forming a planarization layer 670 was performed.

However, according to the present disclosure, since the semiconductor light-emitting element 1500 is fixed in the hole 1410 by AlO$_x$(a) produced inside the hole 1410 during the self-assembly process, the step of fixing the semiconductor light-emitting element 1500 through a post-process may be omitted. Therefore, as illustrated in the drawing, the step of forming the planarization layer 1700 on the barrier rib 1500 may be directly performed. For example, the planarization layer 1700 may be formed by coating a photosensitive organic material on the barrier rib 1400, and may alternatively be formed using other materials and methods.

Next, a step of forming wiring electrodes 1600, which are electrically connected to the semiconductor light-emitting element 1500, on the substrate may be performed.

To form the wiring electrodes 1600, a first electrode hole 1710 and a second electrode hole 1720 may be formed in the planarization layer 1700, and a passivation layer 1560 of the semiconductor light-emitting element 1500 may selectively be removed at positions corresponding to the first and second electrode holes 1710 and 1720. The process of exposing the first and second conductive electrodes 1510 and 1550 of the semiconductor light-emitting element while forming the first electrode hole 1710 and the second electrode hole 1720 may be performed through a photolithography process and an etching process.

Thereafter, a first electrode 1610 and a second electrode 1620 may extend to the first and second conductive electrodes 1510 and 1550 of the semiconductor light-emitting element through the first and second electrode holes 1710 and 1720, respectively, so that the semiconductor light-emitting element and the wiring electrodes 1600 are electrically connected. For example, the first and second electrodes 1610 and 1620 may be formed of transparent electrodes such as ITO. In addition, the first electrode 1610 and the second electrode 1620 may be electrically insulated on the planarization layer 1700 by being isolated by an insulating layer (not illustrated), and tops of the first electrode 1610 and the second electrode 1620 may be covered with another insulating layer.

One side of the first electrode 1610 and one side of the second electrode 1620 may be connected to the conductive electrodes 1510 and 1550 of the semiconductor light-emitting element, and another sides may be electrically connected to the electrodes disposed on the substrate to turn on or off the semiconductor light-emitting element 1500.

Through those processes, the display device 1000 according to the present disclosure can be manufactured.

The above description is only an illustrative example of the technical idea of the present disclosure, and those skilled in the art will be able to make various modifications and variations without departing from the essential characteristics of the present disclosure.

Therefore, the embodiments disclosed in the present disclosure are not intended to limit the technical spirit of the present disclosure, but to explain, and the scope of the technical spirit of the present disclosure is not limited by these embodiments.

The protection scope of the present disclosure should be construed according to the claims below, and all technical ideas within the scope equivalent thereto should be construed as being included in the scope of the present disclosure.

The invention claimed is:

1. A display device comprising:
    a base;
    a plurality of assembly electrodes extending in one direction and disposed on the base;
    a dielectric layer disposed to cover the assembly electrodes;
    a barrier rib stacked on the dielectric layer while forming holes to overlap the assembly electrodes;
    semiconductor light-emitting elements disposed inside the holes; and
    wiring electrodes electrically connected to the semiconductor light-emitting elements,
    wherein each of the holes contains a by-product produced by materials constituting the assembly electrodes and the dielectric layer therein, and
    wherein the by-product is produced in at least one region between the semiconductor light-emitting element and the dielectric layer and between the semiconductor light-emitting element and the barrier rib.

2. The display device of claim 1, wherein the by-product is AlO$_x$.

3. The display device of claim 2, wherein the AlO$_x$ is produced irregularly inside the holes.

4. The display device of claim 1, wherein each of the assembly electrodes includes a plurality of layers, and
    wherein a layer in contact with the dielectric layer, among the plurality of layers, is formed to contain Al.

5. The display device of claim 1, wherein the dielectric layer is made of an Al$_2$O$_3$ material.

6. The display device of claim 1, wherein the dielectric layer is a porous layer made of an SiO$_2$ or SiN$_x$ material.

7. The display device of claim 1, wherein each of the semiconductor light-emitting elements comprises:
    a first conductive electrode;
    a first conductive semiconductor layer having the first conductive electrode formed thereon;
    an active layer formed on the first conductive semiconductor layer;
    a second conductive semiconductor layer formed on the active layer; and
    a second conductive electrode formed on the second conductive semiconductor layer, and
    wherein the semiconductor light-emitting element is formed symmetrically with respect to at least one direction.

8. The display device of claim 7, wherein at least one of the first conductive electrode and the second conductive electrode contains a magnetic substance.

9. The display device of claim 7, further comprising a planarization layer formed to cover one surface of the semiconductor light-emitting element, wherein the planarization layer comprises:

a first electrode hole exposing the first conductive electrode of the semiconductor light-emitting element; and a second electrode hole exposing the second conductive electrode of the semiconductor light-emitting element.

10. The display device of claim 9, wherein the wiring electrodes are disposed on the planarization layer, and wherein the wiring electrodes are electrically connected to the semiconductor light-emitting element through the first electrode hole and the second electrode hole, respectively.

11. A display device A display device comprising:

a base;

a plurality of assembly electrodes extending in one direction and disposed on the base;

a dielectric layer disposed to cover the assembly electrodes;

a barrier rib stacked on the dielectric layer while forming holes to overlap the assembly electrodes;

semiconductor light-emitting elements disposed inside the holes; and wiring electrodes electrically connected to the semiconductor light-emitting elements, wherein the assembly electrodes are formed to contain Al, wherein each of the holes contains $AlO_x$ therein, wherein each of the assembly electrodes includes a plurality of layers, and wherein a layer in contact with the dielectric layer, among the plurality of layers, is formed to contain Al.

* * * * *